(12) United States Patent
Katkar et al.

(10) Patent No.: US 11,955,393 B2
(45) Date of Patent: Apr. 9, 2024

(54) STRUCTURES FOR BONDING ELEMENTS INCLUDING CONDUCTIVE INTERFACE FEATURES

(71) Applicant: ADEIA SEMICONDUCTOR BONDING TECHNOLOGIES INC., San Jose, CA (US)

(72) Inventors: Rajesh Katkar, Milpitas, CA (US); Laura Wills Mirkarimi, Sunol, CA (US); Bongsub Lee, Mountain View, CA (US); Gaius Gillman Fountain, Jr., Youngsville, NC (US); Cyprian Emeka Uzoh, San Jose, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 127 days.

(21) Appl. No.: 17/315,170

(22) Filed: May 7, 2021

(65) Prior Publication Data
US 2021/0265227 A1    Aug. 26, 2021

Related U.S. Application Data

(62) Division of application No. 16/235,585, filed on Dec. 28, 2018, now Pat. No. 11,004,757.
(Continued)

(51) Int. Cl.
*H01L 23/10*        (2006.01)
*H01L 21/768*       (2006.01)
*H01L 23/00*        (2006.01)

(52) U.S. Cl.
CPC ........ *H01L 23/10* (2013.01); *H01L 21/76807* (2013.01); *H01L 21/76816* (2013.01); *H01L 24/08* (2013.01); *H01L 2924/01029* (2013.01)

(58) Field of Classification Search
CPC .................................................. H01L 23/02–10
See application file for complete search history.

(56) References Cited

U.S. PATENT DOCUMENTS

| 4,998,665 | A | 3/1991 | Hayashi |
| 5,087,585 | A | 2/1992 | Hayashi |

(Continued)

FOREIGN PATENT DOCUMENTS

| CN | 101554988 | | 10/2009 |
| CN | 109390305 | A | 2/2019 |

(Continued)

OTHER PUBLICATIONS

Amirfeiz et al., "Formation of silicon structures by plasma-activated wafer bonding," Journal of The Electrochemical Society, 2000, vol. 147, No. 7, pp. 2693-2698.
(Continued)

*Primary Examiner* — Laura M Menz
*Assistant Examiner* — Candice Chan
(74) *Attorney, Agent, or Firm* — Knobbe, Martens, Olson & Bear, LLP

(57) ABSTRACT

A bonded structure is disclosed. The bonded structure includes a first element and a second element that is bonded to the first element along a bonding interface. The bonding interface has an elongate conductive interface feature and a nonconductive interface feature. The bonded structure also includes an integrated device that is coupled to or formed with the first element or the second element. The elongate conductive interface feature has a recess through a portion of a thickness of the elongate conductive interface feature. A portion of the nonconductive interface feature is disposed in the recess.

10 Claims, 21 Drawing Sheets

Related U.S. Application Data

(60) Provisional application No. 62/686,534, filed on Jun. 18, 2018, provisional application No. 62/671,377, filed on May 14, 2018.

(56) References Cited

U.S. PATENT DOCUMENTS

| | | |
|---|---|---|
| 5,322,593 A | 6/1994 | Hasegawa et al. |
| 5,753,536 A | 5/1998 | Sugiyama et al. |
| 5,771,555 A | 6/1998 | Eda et al. |
| 5,985,739 A | 11/1999 | Plettner et al. |
| 5,998,808 A | 12/1999 | Matsushita |
| 6,008,126 A | 12/1999 | Leedy |
| 6,080,640 A | 6/2000 | Gardner et al. |
| 6,265,775 B1 | 7/2001 | Seyyedy |
| 6,374,770 B1 | 4/2002 | Lee |
| 6,423,640 B1 | 7/2002 | Lee et al. |
| 6,465,892 B1 | 10/2002 | Suga |
| 6,872,984 B1 | 3/2005 | Leung |
| 6,876,062 B2 | 4/2005 | Lee et al. |
| 6,887,769 B2 | 5/2005 | Kellar et al. |
| 6,908,027 B2 | 6/2005 | Tolchinsky et al. |
| 6,998,712 B2 | 2/2006 | Okada et al. |
| 7,045,453 B2 | 5/2006 | Canaperi et al. |
| 7,057,274 B2 | 6/2006 | Heschel |
| 7,078,811 B2 | 7/2006 | Suga |
| 7,105,980 B2 | 9/2006 | Abbott et al. |
| 7,193,423 B1 | 3/2007 | Dalton et al. |
| 7,354,798 B2 | 4/2008 | Pogge et al. |
| 7,359,591 B2 | 4/2008 | Vandentop et al. |
| 7,388,281 B2 | 6/2008 | Krueger et al. |
| 7,467,897 B2 | 12/2008 | Hauffe et al. |
| 7,622,324 B2 | 11/2009 | Enquist et al. |
| 7,750,488 B2 | 7/2010 | Patti et al. |
| 7,803,693 B2 | 9/2010 | Trezza |
| 7,972,683 B2 | 7/2011 | Gudeman et al. |
| 8,183,127 B2 | 5/2012 | Patti et al. |
| 8,191,756 B2 | 6/2012 | Coppeta et al. |
| 8,241,961 B2 | 8/2012 | Kim et al. |
| 8,269,671 B2 | 9/2012 | Chen et al. |
| 8,314,007 B2 | 11/2012 | Vaufredaz |
| 8,349,635 B1 | 1/2013 | Gan et al. |
| 8,357,931 B2 | 1/2013 | Schieck et al. |
| 8,377,798 B2 | 2/2013 | Peng et al. |
| 8,395,229 B2 | 3/2013 | Garcia-Blanco et al. |
| 8,411,444 B2 | 4/2013 | Gaynes et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,530,997 B1 | 9/2013 | Yang et al. |
| 8,546,928 B2 | 10/2013 | Merz et al. |
| 8,620,164 B2 | 12/2013 | Heck et al. |
| 8,647,987 B2 | 2/2014 | Yang et al. |
| 8,669,602 B2 | 3/2014 | Hayashi |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 8,916,448 B2 | 12/2014 | Cheng et al. |
| 8,988,299 B2 | 3/2015 | Kam et al. |
| 9,093,350 B2 | 7/2015 | Endo et al. |
| 9,119,313 B2 | 8/2015 | Zhang et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,318,471 B2 | 4/2016 | Kabe et al. |
| 9,337,235 B2 | 5/2016 | Chen et al. |
| 9,368,866 B2 | 6/2016 | Yu |
| 9,385,024 B2 | 7/2016 | Tong et al. |
| 9,386,688 B2 | 7/2016 | MacDonald et al. |
| 9,391,143 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,601,454 B2 | 3/2017 | Zhao et al. |
| 9,620,464 B2 | 4/2017 | Baks et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,768,307 B2 | 9/2017 | Yamazaki et al. |
| 9,799,587 B2 | 10/2017 | Fujii et al. |
| 9,834,435 B1 | 12/2017 | Liu et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,615,133 B2 | 4/2020 | Kamgaing et al. |
| 10,658,312 B2 | 5/2020 | Kamgaing et al. |
| 10,707,087 B2 | 7/2020 | Uzoh et al. |
| 10,727,219 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,503 B2 | 5/2021 | Wang et al. |
| 11,031,285 B2 | 6/2021 | Katkar et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,205,600 B2 | 12/2021 | Shen et al. |
| 11,256,004 B2 | 2/2022 | Haba et al. |
| 11,257,727 B2 | 2/2022 | Katkar et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |

(56) References Cited

U.S. PATENT DOCUMENTS

| | | |
|---|---|---|
| 11,348,898 B2 | 5/2022 | DeLaCruz et al. |
| 11,355,443 B2 | 6/2022 | Huang et al. |
| 11,417,576 B2 | 8/2022 | Katkar et al. |
| 11,485,670 B2 | 11/2022 | Ruben et al. |
| 11,600,542 B2 | 3/2023 | Huang et al. |
| 2002/0000328 A1 | 1/2002 | Motomura et al. |
| 2002/0003307 A1 | 1/2002 | Suga |
| 2002/0094608 A1 | 7/2002 | Brooks |
| 2002/0179921 A1 | 12/2002 | Cohn |
| 2003/0098060 A1 | 5/2003 | Yoshimi |
| 2004/0084414 A1 | 5/2004 | Sakai et al. |
| 2004/0259325 A1 | 12/2004 | Gan |
| 2005/0009246 A1 | 1/2005 | Enquist et al. |
| 2005/0082653 A1 | 4/2005 | McWilliams et al. |
| 2005/0263866 A1 | 12/2005 | Wan |
| 2006/0001123 A1 | 1/2006 | Heck et al. |
| 2006/0057945 A1 | 3/2006 | Hsu et al. |
| 2006/0097335 A1 | 5/2006 | Kim et al. |
| 2006/0115323 A1 | 6/2006 | Coppeta et al. |
| 2006/0197215 A1 | 9/2006 | Potter |
| 2006/0208326 A1 | 9/2006 | Nasiri et al. |
| 2007/0029562 A1 | 2/2007 | Koizumi |
| 2007/0045781 A1 | 3/2007 | Carlson et al. |
| 2007/0045795 A1 | 3/2007 | McBean |
| 2007/0096294 A1 | 5/2007 | Ikeda et al. |
| 2007/0111386 A1 | 5/2007 | Kim et al. |
| 2007/0134891 A1 | 6/2007 | Adetutu et al. |
| 2007/0188054 A1 | 8/2007 | Hasken et al. |
| 2007/0222048 A1 | 9/2007 | Huang |
| 2007/0295456 A1 | 12/2007 | Gudeman et al. |
| 2008/0080832 A1 | 4/2008 | Chen et al. |
| 2008/0124835 A1 | 5/2008 | Chen et al. |
| 2008/0283995 A1 | 11/2008 | Bucki et al. |
| 2008/0290490 A1 | 11/2008 | Fujii et al. |
| 2008/0296709 A1 | 12/2008 | Haba et al. |
| 2009/0053855 A1 | 2/2009 | Summers |
| 2009/0186446 A1 | 7/2009 | Kwon et al. |
| 2009/0267165 A1 | 10/2009 | Okudo et al. |
| 2010/0078786 A1 | 4/2010 | Maeda |
| 2010/0096713 A1 | 4/2010 | Jung |
| 2010/0148341 A1 | 6/2010 | Fuji et al. |
| 2010/0181676 A1 | 7/2010 | Montez et al. |
| 2010/0288525 A1 | 11/2010 | Basavanhally et al. |
| 2010/0301432 A1 | 12/2010 | Kittilsland et al. |
| 2011/0031633 A1 | 2/2011 | Hsu et al. |
| 2011/0115092 A1 | 5/2011 | Tago |
| 2011/0147859 A1 | 6/2011 | Tanaka et al. |
| 2011/0156242 A1 | 6/2011 | Sakaguchi et al. |
| 2011/0180921 A1 | 7/2011 | Loiselet |
| 2011/0290552 A1 | 12/2011 | Palmateer et al. |
| 2012/0061776 A1 | 3/2012 | Cheng et al. |
| 2012/0097733 A1 | 4/2012 | Ebefors et al. |
| 2012/0100657 A1 | 4/2012 | Di Cioccio et al. |
| 2012/0112335 A1 | 5/2012 | Ebefors et al. |
| 2012/0142144 A1 | 6/2012 | Taheri |
| 2012/0212384 A1 | 8/2012 | Kam et al. |
| 2012/0267730 A1 | 10/2012 | Renard et al. |
| 2012/0286380 A1 | 11/2012 | Yazdi et al. |
| 2012/0326248 A1 | 12/2012 | Daneman et al. |
| 2013/0099331 A1 | 4/2013 | Chen et al. |
| 2013/0122702 A1 | 5/2013 | Volant et al. |
| 2013/0187245 A1 | 7/2013 | Chien et al. |
| 2013/0271066 A1 | 10/2013 | Signorelli et al. |
| 2013/0277774 A1 | 10/2013 | Frey et al. |
| 2013/0277777 A1 | 10/2013 | Chang et al. |
| 2013/0293428 A1 | 11/2013 | Souriau et al. |
| 2014/0175655 A1 | 6/2014 | Chen et al. |
| 2014/0197534 A1 | 7/2014 | Partosa et al. |
| 2014/0217557 A1 | 8/2014 | Chen et al. |
| 2014/0225206 A1 | 8/2014 | Lin et al. |
| 2014/0225795 A1 | 8/2014 | Yu |
| 2014/0264653 A1 | 9/2014 | Cheng et al. |
| 2014/0361413 A1 | 12/2014 | Chapelon |
| 2015/0001632 A1 | 1/2015 | Liu et al. |
| 2015/0064498 A1 | 3/2015 | Tong |
| 2015/0068666 A1 | 3/2015 | Abe et al. |
| 2015/0091153 A1 | 4/2015 | Liu et al. |
| 2015/0097215 A1 | 4/2015 | Chu et al. |
| 2015/0137345 A1 | 5/2015 | Choi et al. |
| 2015/0298965 A1 | 10/2015 | Tsai et al. |
| 2015/0336790 A1 | 11/2015 | Geen et al. |
| 2015/0336792 A1 | 11/2015 | Huang et al. |
| 2016/0002029 A1 | 1/2016 | Nasiri et al. |
| 2016/0107881 A1 | 4/2016 | Thompson et al. |
| 2016/0137492 A1 | 5/2016 | Cheng et al. |
| 2016/0229685 A1 | 8/2016 | Boysel |
| 2016/0240495 A1 | 8/2016 | Lachner et al. |
| 2016/0318757 A1 | 11/2016 | Chou et al. |
| 2016/0343682 A1 | 11/2016 | Kawasaki |
| 2017/0008757 A1 | 1/2017 | Cheng et al. |
| 2017/0062366 A1 | 3/2017 | Enquist |
| 2017/0081181 A1 | 3/2017 | Zhang et al. |
| 2017/0137281 A1 | 5/2017 | Favier et al. |
| 2017/0179029 A1 | 6/2017 | Enquist et al. |
| 2017/0186732 A1 | 6/2017 | Chu et al. |
| 2017/0194271 A1 | 7/2017 | Hsu et al. |
| 2017/0200711 A1 | 7/2017 | Uzoh et al. |
| 2017/0305738 A1 | 10/2017 | Chang et al. |
| 2017/0338214 A1 | 11/2017 | Uzoh et al. |
| 2018/0044175 A1 | 2/2018 | Ogashiwa et al. |
| 2018/0047682 A1 | 2/2018 | Chang et al. |
| 2018/0096931 A1 | 4/2018 | Huang et al. |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0269161 A1 | 9/2018 | Wu et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0337157 A1 | 11/2018 | Wang et al. |
| 2019/0051628 A1 | 2/2019 | Liu et al. |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0164914 A1 | 5/2019 | Hu et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0043817 A1 | 2/2020 | Shen et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0131028 A1 | 4/2020 | Cheng et al. |
| 2020/0140267 A1 | 5/2020 | Katkar et al. |
| 2020/0140268 A1 | 5/2020 | Katkar et al. |
| 2020/0144217 A1 | 5/2020 | Enquist et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |

(56) References Cited

U.S. PATENT DOCUMENTS

| | | |
|---|---|---|
| 2021/0098412 A1 | 4/2021 | Haba et al. |
| 2021/0118864 A1 | 4/2021 | DeLaCruz et al. |
| 2021/0134689 A1 | 5/2021 | Huang et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0202428 A1 | 7/2021 | Wang et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2022/0367302 A1 | 11/2022 | Katkar et al. |
| 2022/0415734 A1 | 12/2022 | Katkar et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |

FOREIGN PATENT DOCUMENTS

| | | |
|---|---|---|
| EP | 2813465 A1 | 12/2014 |
| JP | H10-112517 | 4/1998 |
| JP | 2000-100679 | 4/2000 |
| JP | 2001-102479 | 4/2001 |
| JP | 2001-148436 | 5/2001 |
| JP | 2002-353416 | 12/2002 |
| JP | 2008-130915 | 6/2008 |
| JP | 2009-238905 | 10/2009 |
| JP | 2010-199608 | 9/2010 |
| JP | 2013-33786 | 2/2013 |
| JP | 2013-513227 | 4/2013 |
| JP | 2013-243333 | 12/2013 |
| JP | 2014-219321 | 11/2014 |
| JP | 2015-100886 | 6/2015 |
| JP | 2018-160519 | 10/2018 |
| KR | 10-2005-0101324 | 10/2005 |
| KR | 10-2015-0097798 | 8/2015 |
| KR | 10-2017-0108143 | 9/2017 |
| TW | 201210098 A1 | 3/2012 |
| WO | WO 2005/043584 A2 | 5/2005 |
| WO | WO 2006/100444 A1 | 9/2006 |
| WO | WO 2007/103224 A2 | 9/2007 |
| WO | WO 2012/130730 A1 | 10/2012 |
| WO | WO 2014-074403 A1 | 5/2014 |
| WO | WO 2017/100256 A1 | 6/2017 |
| WO | WO 2017/151442 A1 | 9/2017 |

OTHER PUBLICATIONS

Beer et al., "Coplanar 122GHz Antenna Array With Air Cavity Reflector for Integration in Plastic Packages", IEEE Antennas and Wireless Propagation Letters, 11:160-163, Jan. 2012.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

Daneman, "Applying the CMOS Test Flow to MEMS Manufacturing", InvenSense, Inc., accessed on Apr. 5, 2020.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Gösele et al., "Semiconductor Wafer Bonding: A flexible approach to materials combinations in microelectronics; micromechanics and optoelectronics," IEEE, 1997, pp. 23-32.

Gu et al., "A Multilayer Organic Package with 64 Dual-Polarized Antennas for 28GHz 5G Communication", IBM Research, pp. 1-3, 2017.

Hosoda et al., "Effect of the surface treatment on the room-temperature bonding of Al to Si and SiO2," Journal of Materials Science, Jan. 1, 1998, vol. 33, Issue 1, pp. 253-258.

Hosoda et al., "Room temperature GaAs-Si and InP-Si wafer direct bonding by the surface activated bonding method," Nuclear Inst. And Methods in Physics Research B, 1997, vol. 121, Nos. 1-4, pp. 203-206.

Howlader et al., "A novel method for bonding of ionic wafers," Electronics Components and Technology Conference, 2006, IEEE, p. 7—pp.

Howlader et al., "Bonding of p-Si/n-InP wafers through surface activated bonding method at room temperature," Indium Phosphide and Related Materials, 2001, IEEE International Conference On, pp. 272-275.

Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.

Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.

Inertial MEMS Manufacturing Trends 2014 Report by Yole Developpement Sample Report, Slide 11, https://www.slideshare.net/Yole_Developpement/yole-inertial-memsmanufacturingtrends2014sample.

International Search Report and Written Opinion dated Apr. 13, 2018 in International Application No. PCT/US2017/067742, 14 pages.

International Search Report and Written Opinion dated Apr. 16, 2018 in International Application No. PCT/US2017/067741, 17 pages.

(56) References Cited

OTHER PUBLICATIONS

International Search Report and Written Opinion dated May 31, 2018 in International Application No. PCT/US2018/022688, 2 pages.
International Search Report and Written Opinion dated Mar. 7, 2019, in International Application No. PCT/US2018/060044, 14 pages.
International Search Report and Written Opinion dated Apr. 22, 2019 in International Application No. PCT/US2018/064982, 13 pages.
International Search Report and Written Opinion dated Aug. 26, 2019 in International Application No. PCT/US2019/031113, 14 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu-SiO2 at low temperature," Proceedings—Electrochemical Society, 2003, vol. 19, pp. 239-247.
Matsuzawa et al., "Room-temperature interconnection of electroplated Au microbump by means of surface activated bonding method," Electornic Components and Technology Confererence, 2001, 51st Proceedings, IEEE, pp. 384-387.
Moriceau, H. et al., "Overview of recent direct wafer bonding advances and applications," Advances in Natural Sciences—Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Norton, Francis, "Permeation of gases through solids," Journal of Applied Physics, Jan. 1957, vol. 28, No. 1.
Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.

Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," TRANDUCERS, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, TRANSDUCERS '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.

(56) References Cited

OTHER PUBLICATIONS

Tong et al., "Low temperature wafer direct bonding," Journal of Microelectomechanical systems, Mar. 1994, vol. 3, No. 1, pp. 29-35.

Topol et al., "Enabling technologies for wafer-level bonding of 3D MEMS and integrated circuit structures," 2004 Electronics Components and Technology Conference, 2004 IEEE, pp. 931-938.

Wang et al., "Reliability and microstructure of Au—Al and Au—Cu direct bonding fabricated by the Surface Activated Bonding," Electronic Components and Technology Conference, 2002, IEEE, pp. 915-919.

Wang et al., "Reliability of Au bump—Cu direct interconnections fabricated by means of surface activated bonding method," Microelectronics Reliability, May 2003, vol. 43, Issue 5, pp. 751-756.

Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.

Xu et al., "New Au—Al interconnect technology and its reliability by surface activated bonding," Electronic Packaging Technology Proceedings, Oct. 28-30, 2003, Shanghai, China, pp. 479-483.

Zhang et al., "Antenna-on-Chip and Antenna-in-Package Solutions to Highly Integrated Millimeter-Wave Devices for Wireless Communications", IEEE Transactions on Antennas and Propagation, 57(10):2830-2841, Oct. 2009.

Zhou et al., "A Wideband Circularly Polarized Patch Antenna for 60 GHz Wireless Communications", Wireless Engineering and Technology, 3:97-105, 2012.

Zoschke, K. et al., "Hermetic wafer level packaging of MEMS components using through silicon via and wafer to wafer bonding technologies," 2013 Electronic Components & Technology Conference, 2013 IEEE, pp. 1500-1507.

"The Advantages of Integrated MEMS to Enable the Internet of Moving Things", mCube, White Paper Jan. 2018.

Ceramic Microstructures: Control at the Atomic Level, Recent Progress in Surface Activated Bonding, 1998, pp. 385-389.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

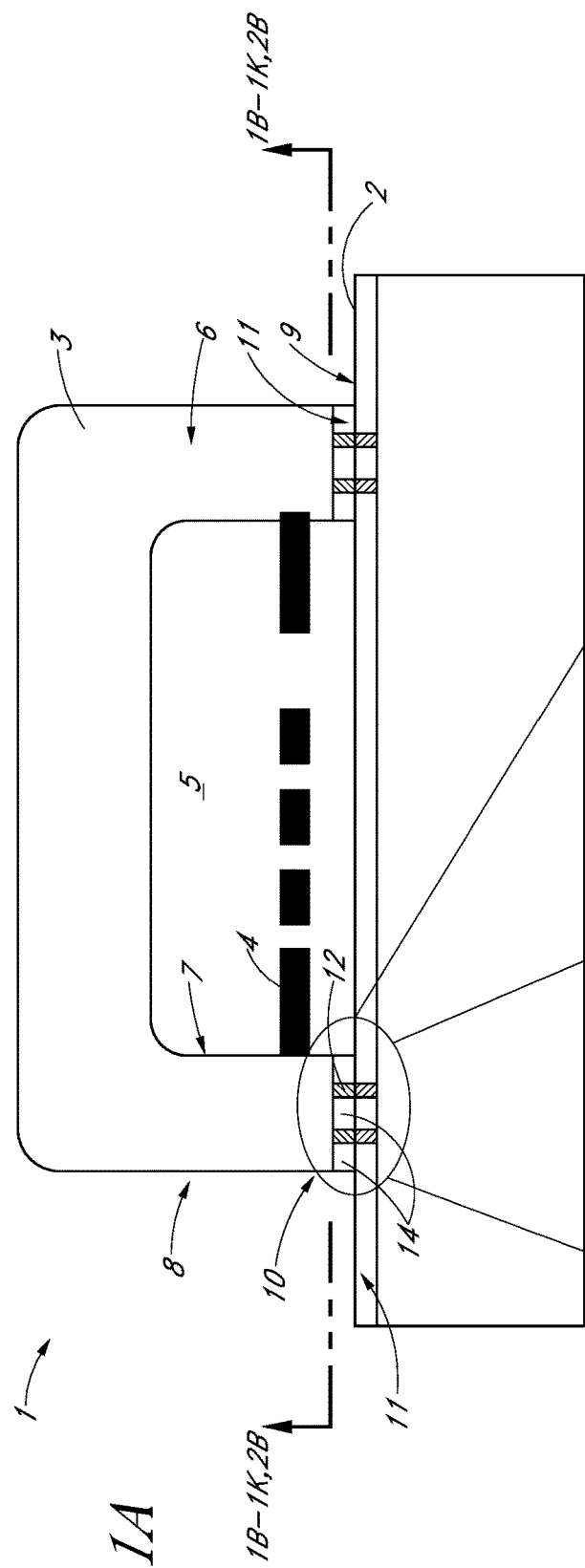

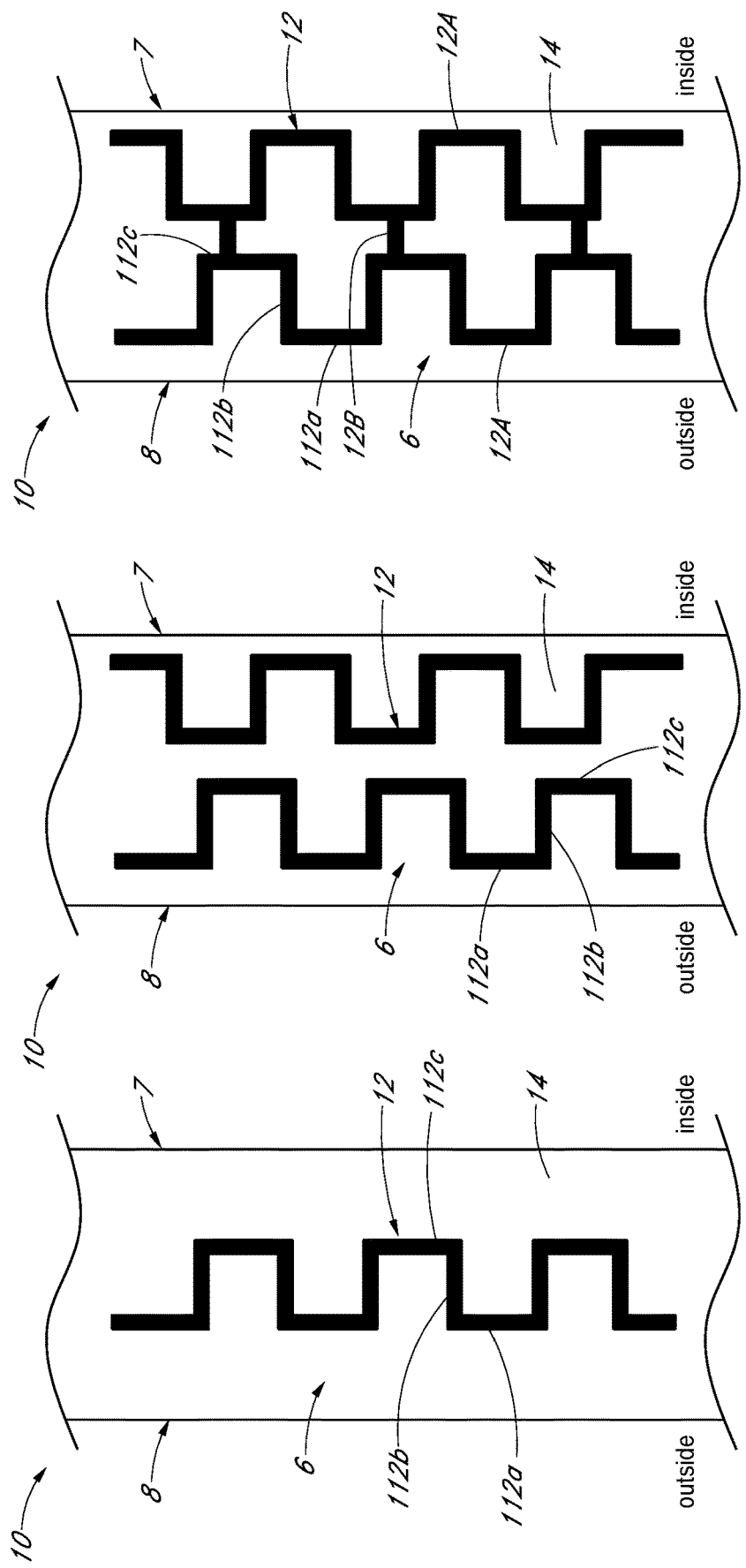

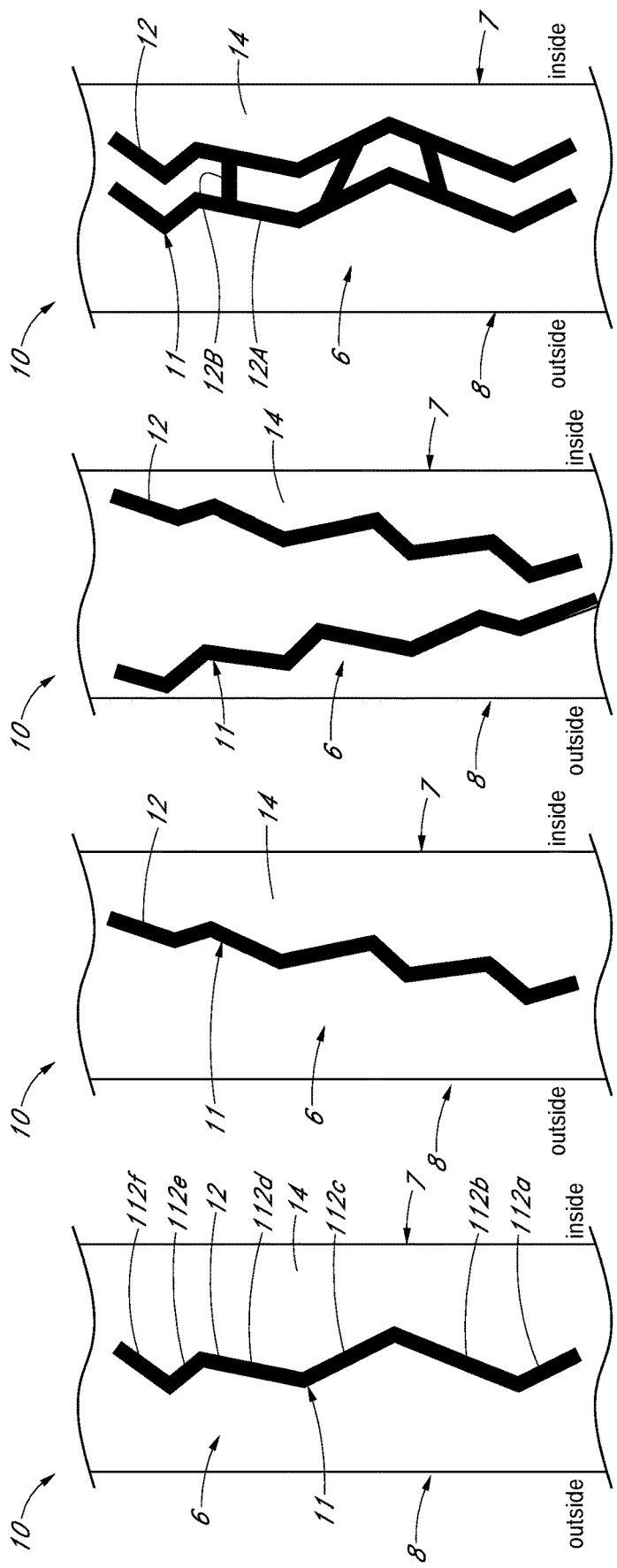

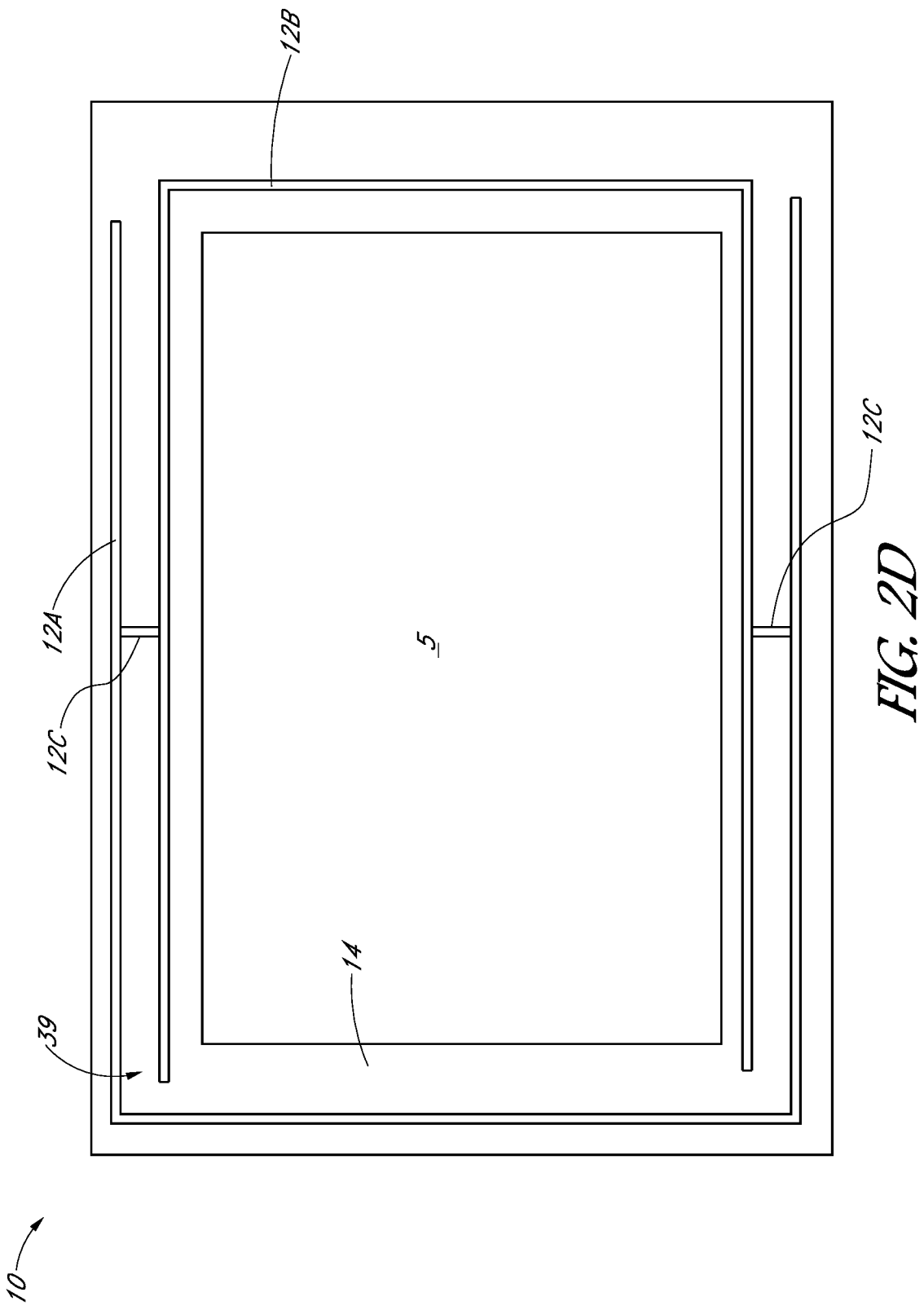

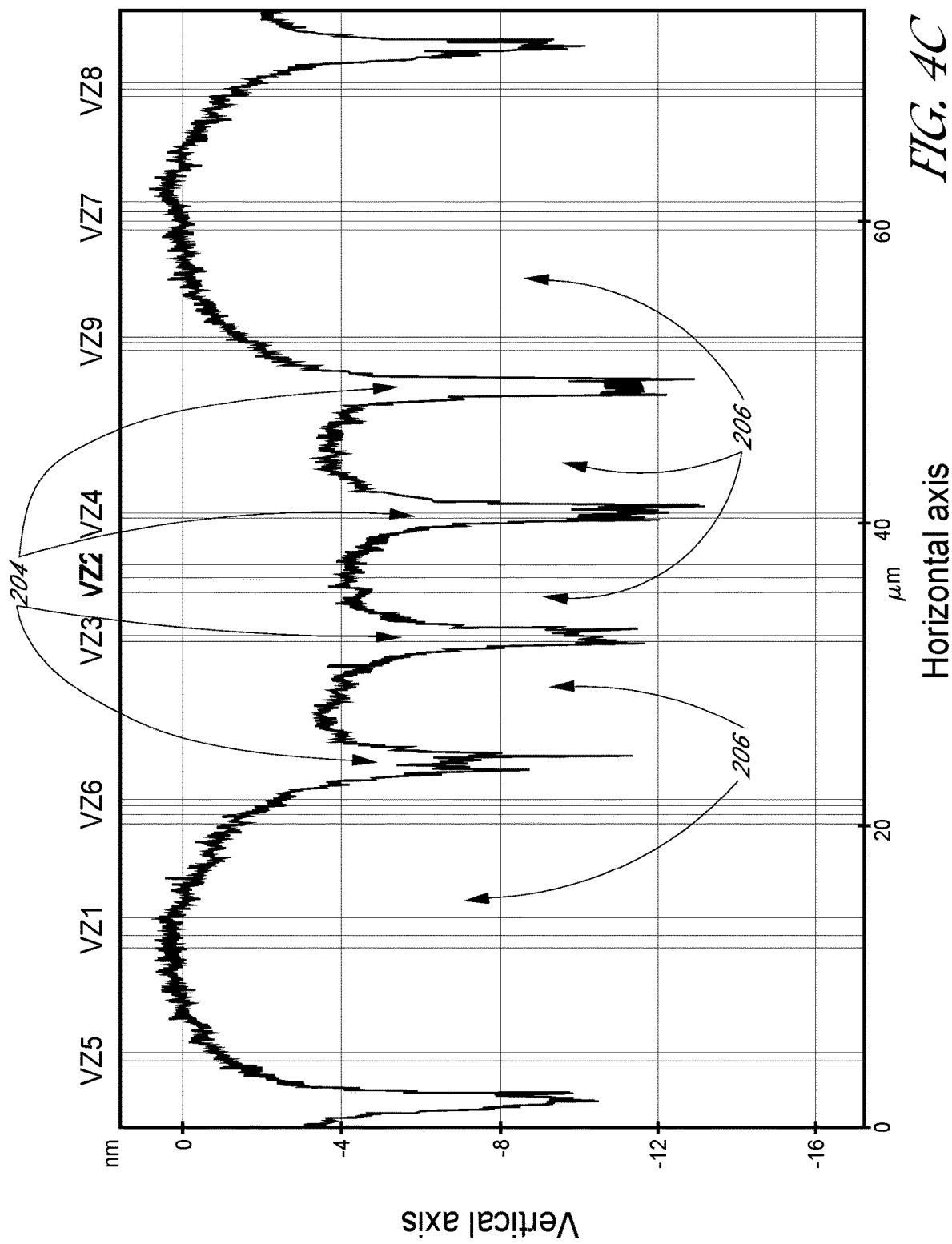

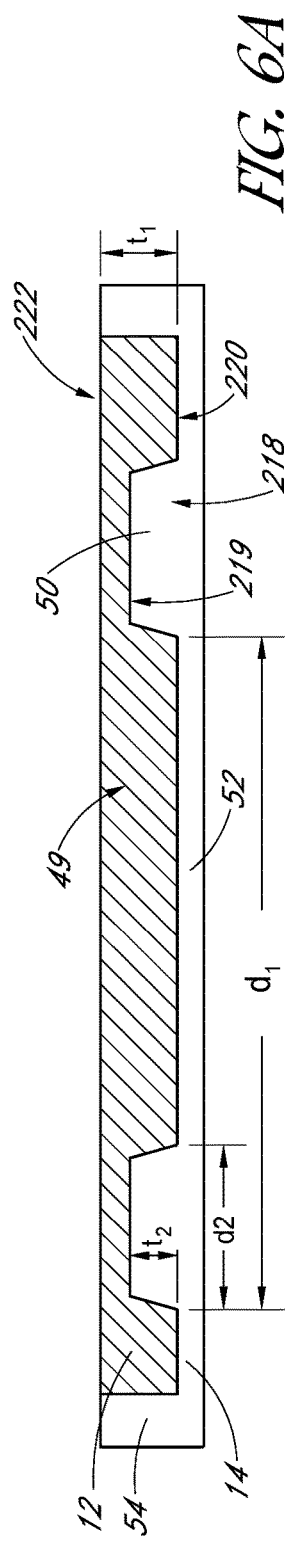
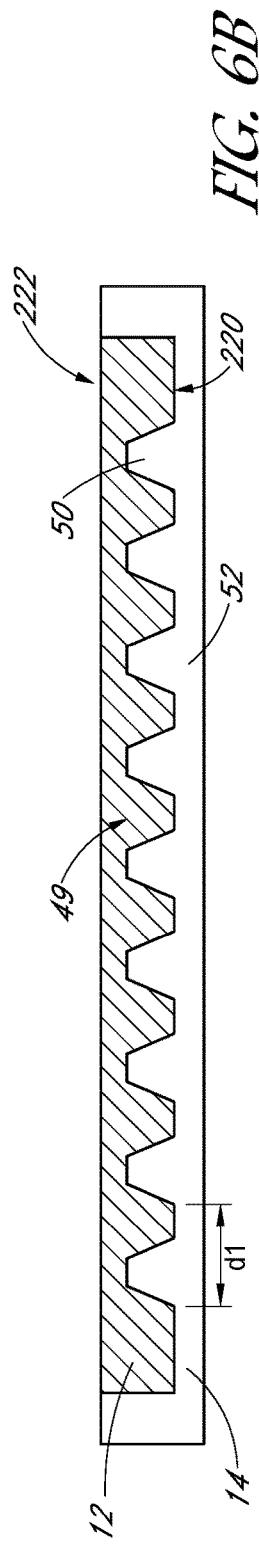
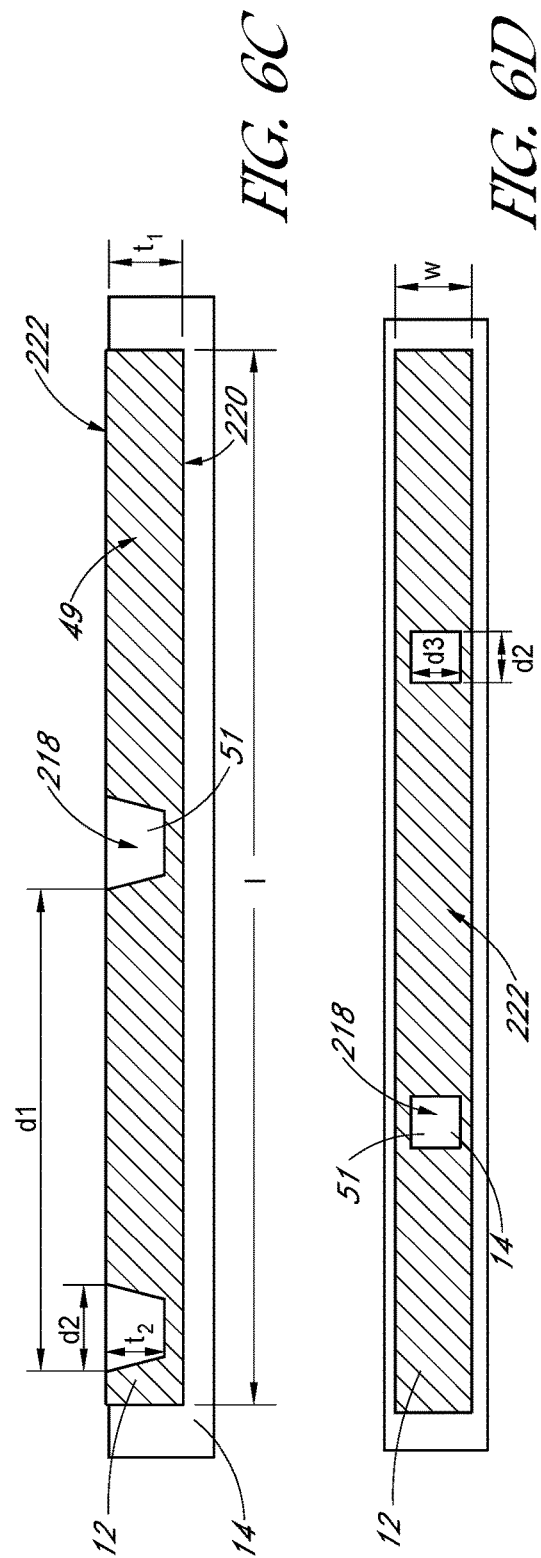
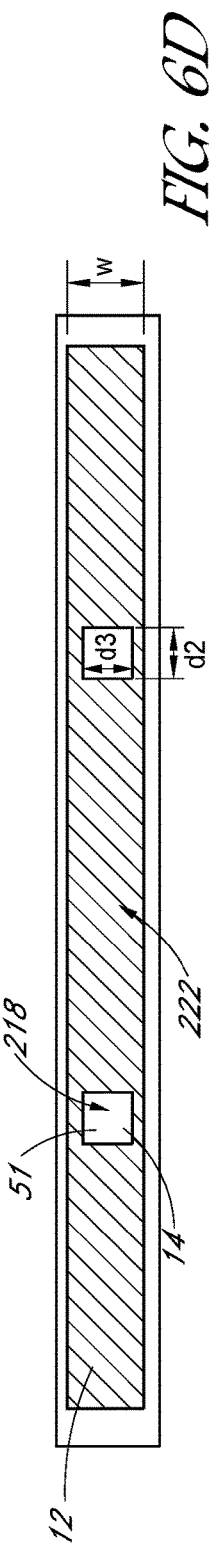
FIG. 6A
FIG. 6B
FIG. 6C
FIG. 6D

STRUCTURES FOR BONDING ELEMENTS INCLUDING CONDUCTIVE INTERFACE FEATURES

CROSS-REFERENCE TO RELATED APPLICATIONS

This application is a divisional of U.S. patent application Ser. No. 16/235,585, filed Dec. 28, 2018, (issued on May 11, 2021 as U.S. Pat. No. 11,004,757), titled "STRUCTURES FOR BONDING ELEMENTS," which claims priority to U.S. Provisional Patent Application No. 62/686,534, filed Jun. 18, 2018, titled "CAVITY PACKAGES," and also claims priority to U.S. Provisional Patent Application No. 62/671,377, filed May 14, 2018, titled "CAVITY PACKAGES," the entire contents of each of which are hereby incorporated herein by reference.

BACKGROUND

Field of the Invention

The field generally relates to bonded structures, and in particular, to bonded structures that provide improved sealing between two elements (e.g., two semiconductor elements).

Description of the Related Art

In semiconductor device fabrication and packaging, some integrated devices are sealed from the outside environs in order to, e.g., reduce contamination, maintain vacuum or certain pressure or prevent damage to the integrated device. For example, some microelectromechanical systems (MEMS) devices include a cavity defined by a cap attached to a substrate with an adhesive such as solder. However, some adhesives may be permeable to gases, such that the gases can, over time, pass through the adhesive and into the cavity. Moisture or some gases, such as hydrogen or oxygen gas, can damage sensitive integrated devices. Other adhesives, such as solder, create their own long term reliability issues. Accordingly, there remains a continued need for improved seals for integrated devices.

BRIEF DESCRIPTION OF THE DRAWINGS

FIG. 1A is a schematic side sectional view of a bonded structure, according to various embodiments.

FIGS. 1B-1K are partial schematic sectional plan views of various embodiments of an interface structure defined along a bonded interface of the bonded structure.

FIG. 2D is a schematic sectional plan view of an interface structure having a plurality of conductive interface features disposed about a cavity to define an effectively annular profile, with each conductive interface feature comprising a mostly annular profile.

FIG. 4C shows a graph of a measurement of surface levels of the copper (Cu) regions and the oxide regions of the element in FIG. 4B after annealing at 300° C. for one hour.

FIG. 6A is a cross sectional view of the semiconductor element shown in FIG. 5, taken along the length of the conductive interface feature, according to one embodiment.

FIG. 6B is a cross sectional view of the semiconductor element of FIG. 5, taken along a length of the conductive interface feature, according to one embodiment.

FIG. 6C is a cross sectional view of the semiconductor element of FIG. 5, taken along a length of the conductive interface feature, according to another embodiment.

FIG. 6D is a top plan view of a portion of the conductive and non-conductive features shown in FIG. 6C.

DETAILED DESCRIPTION

Various embodiments disclosed herein relate to semiconductor elements with a conductive interface feature and a nonconductive feature. Various embodiments disclosed herein relate to interface structures that connect two elements (which may comprise semiconductor elements) in a manner that effectively seals integrated devices of the semiconductor elements from the outside environs. For example, in some embodiments, a semiconductor element can comprise a conductive interface feature (e.g., a copper, or Cu, layer) and a nonconductive interface feature (e.g., a silicon oxide layer). For example, in some embodiments, a bonded structure can comprise a plurality of semiconductor elements bonded to one another along an interface structure. An integrated device can be coupled to or formed with a semiconductor element. For example, in some embodiments, the bonded structure can comprise a microelectromechanical systems (MEMS) device in which a cap (a first semiconductor element) is bonded to a carrier (a second semiconductor element). A MEMS element (the integrated device) can be disposed in a cavity defined at least in part by the cap and the carrier.

In some embodiments, the conductive interface feature of the semiconductor element can comprise a recess, and a portion of the nonconductive interface feature can be disposed in the recess. In some embodiments, the recess in the conductive interface feature may prevent and/or mitigate hillock formation when the semiconductor element is annealed.

In some arrangements, the interface structure can comprise one or more conductive interface features disposed about the integrated device, and one or more non-conductive interface features to connect the first and second semiconductor elements and to define an effectively annular or effectively closed profile. In some embodiments, the interface structure can comprise a first conductive interface feature, a second conductive interface feature, and a solid state non-conductive interface feature disposed between the first and second conductive interface features. In some embodiments, each semiconductor element can comprise an associated conductive interface feature, and the conductive interface features can be directly bonded to one another to connect the two semiconductor elements.

Figure 2A:
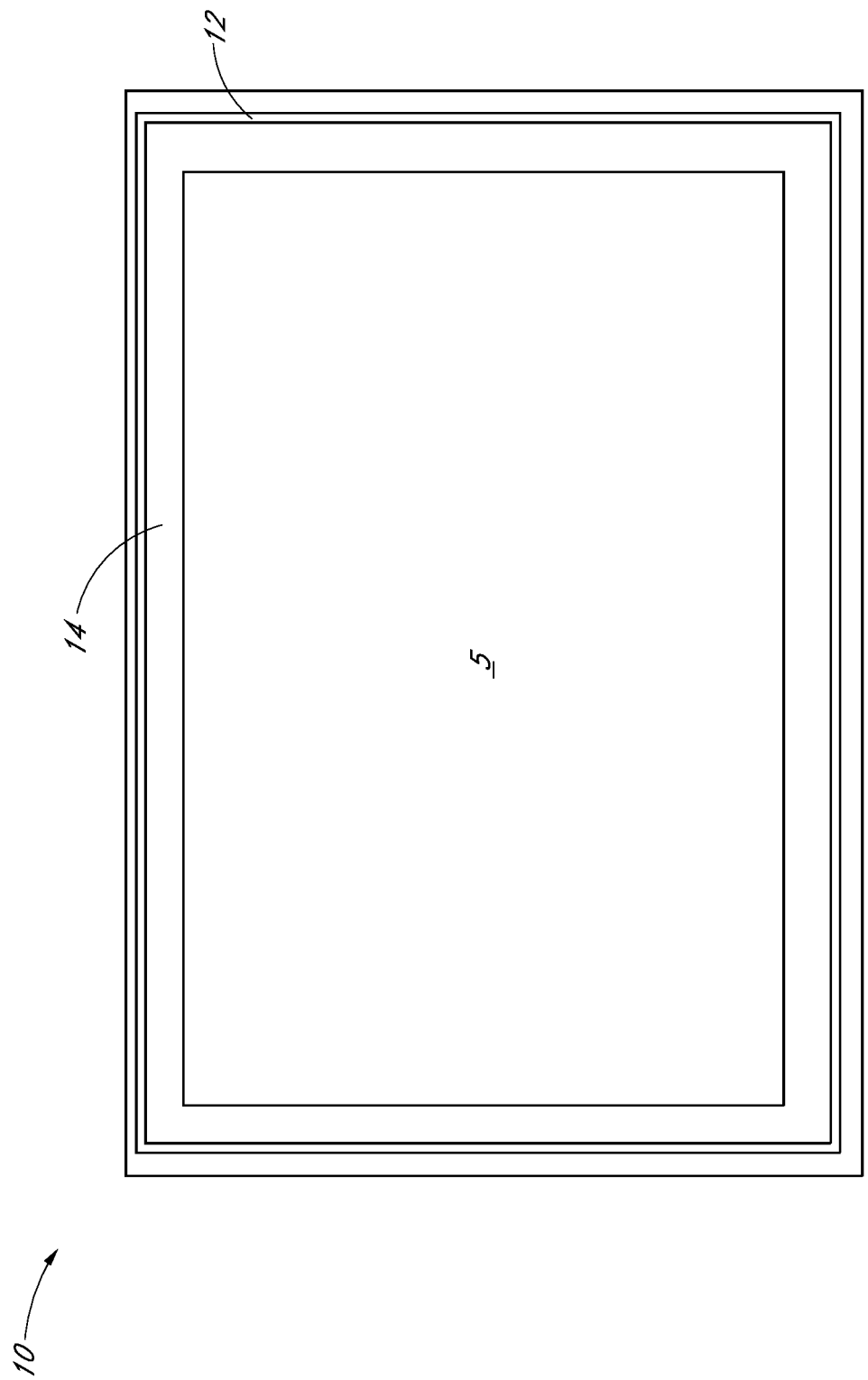
FIG. 2A is a schematic sectional plan view of an interface structure of the bonded structure shown in FIGS. 1A-1B.

FIG. 1A is a schematic side sectional view of a bonded structure 1, according to various embodiments. FIG. 2A is a schematic sectional plan view of an interface structure 10 of the bonded structure 1 shown in FIGS. 1A-1B. The bonded structure 1 can include a first semiconductor element 3 bonded to a second semiconductor element 2 along the interface structure 10. As explained herein, corresponding bonding layers 11 of the first and second semiconductor elements 3, 2 can be directly bonded to one another without an intervening adhesive. As explained below, the interface structure 10 can include conductive interface features 12 embedded in a surrounding non-conductive interface feature 14. As explained herein, the bonding layers 11 of each element 3, 2 can include conductive and non-conductive interface features that can bond to define a seal. As shown in FIG. 1A, the interface features 12, 14 can extend vertically into the semiconductor elements (e.g., into the bonding layers 11), such that the interface features 12, 14 can extend in a direction from one semiconductor element towards the other semiconductor element, e.g., vertically relative to the bonded structure. The first and second semiconductor elements can define a cavity 5 in which an integrated device 4 is at least partially disposed. In the illustrated embodiment, the first semiconductor element 3 can comprise a cap that is shaped to define the cavity, or that is disposed over a cavity in the second semiconductor element 2. For example, the semiconductor element 3 can comprise a wall 6 disposed about the integrated device 4 and separating the cavity 5 from the outside environs. In other embodiments, integrated device 4 may be formed on or be a part of the bonding layer 11 of the second semiconductor element 2, and resides inside the cavity 5 formed within the periphery of the walls 6 of the first semiconductor element 3. In various embodiments, the wall 6 and cap can comprise a semiconductor material, such as silicon. In other embodiments, the wall 6 and cap can comprise a polymer, ceramic, glass, or other suitable material. The cavity 5 can comprise an air cavity, vacuum, or can be filled with a suitable filler material. Although the first and second elements 2, 3 are described herein as semiconductor elements, in other embodiments, the first and second elements 2, 3 can comprise any other suitable type of element, which may or may not comprise a semiconductor material. For example, the elements 2, 3 can comprise various types of optical devices in some embodiments that may not comprise a semiconductor material.

The second semiconductor element 2 can comprise a carrier having an exterior surface 9 to which the first semiconductor element 3 is bonded. In some embodiments, the carrier can comprise a substrate, such as a semiconductor substrate (e.g., a silicon interposer with conductive interconnects), a printed circuit board (PCB), a ceramic substrate, a glass substrate, or any other suitable carrier. In such embodiments, the carrier can transfer signals between the integrated device 4 and a larger packaging structure or electronic system (not shown). In some embodiments, the carrier can comprise an integrated device die, such as a processor die configured to process signals transduced by the integrated device 4. In the illustrated embodiment, the integrated device 4 comprises a MEMS element, such as a MEMS switch, an accelerometer, a gyroscope, etc. The integrated device 4 can be coupled to or formed with the first semiconductor element 3 or the second semiconductor element 2.

In some configurations, it can be important to isolate or separate the integrated device die 4 from the outside environs, e.g., from exposure to gases and/or contaminants. For example, for some integrated devices, exposure to unwanted materials such as moisture or gases (such as hydrogen, oxygen gas, oxides of sulfur or nitrogen or various combinations thereof, etc.) can damage the integrated device 4 or other components. Accordingly, it can be important to provide an interface structure 10 that effectively or substantially seals (e.g., hermetically or near-hermetically seals) the cavity 5 and the integrated device 4 from unwanted materials. As shown in FIGS. 1A and 2A, the interface structure 10 can be arranged to prevent or substantially suppress unwanted materials from passing through the interface structure 10 from an outer surface 8 or outside environment of the structure 1 to an inner surface 7 of the structure 1.

The disclosed embodiments can utilize materials that have low gas permeation rates and can arrange the materials so as to reduce or eliminate the entry of gases into the cavity 5. In other embodiments, the cavity 5 can be filled with a different material, for example nitrogen, to maintain certain pressure for an optimum performance of the device 4. In some embodiments, the permeation of this filler gas from inside the cavity to outside may be beneficial to be reduced or eliminated to maintain the pressure for the sustained performance of device 4 over the life of the product. For example, the permeation rate of some gases (such as hydrogen gas) through metals may be significantly less that the permeation rate of gases through other materials (such as dielectric materials or polymers). Hydrogen gas, for example, may dissociate into its component atoms at or near the outer surface 8. The dissociated atoms may diffuse through the wall 6 or interface structure 10 and recombine at or near the inner surface 7. The diffusion rate of hydrogen gas through metal can be approximately proportional to the square root of the pressure. Other gases, such as rare gases, may not permeate metals at all. By way of comparison, gases may pass through polymer or glass (silicon oxide) materials faster (e.g., proportional to the pressure) since the gas molecules may pass through without dissociating into atoms at the outer wall 8.

Accordingly, the embodiments disclosed herein can beneficially employ metal that defines an effectively annular or closed pattern (see FIGS. 2A-2E) about the integrated device 4 to seal an interior region of the bonded structure (e.g., the cavity 5 and/or integrated device 4) from the outside environs and harmful gases. Beneficially, in some embodiments, the metal pattern can comprise a completely closed loop around the integrated device 4, which may improve sealing relative to other arrangements. In some embodiments, the metal pattern can comprise an incompletely annular pattern, e.g., mostly or partially annular, about the device 4, such that there may be one or more gaps in the metal. Since the permeation rate of gases through metals (such as copper) is significantly less than the permeation rate of gases through dielectric or non-conductive materials (such as silicon oxide, silicon nitride, etc.), the interface structure 10 can provide an improved seal for an interior region of the bonded structure 1.

However, in some embodiments, it may be undesirable to utilize an interface structure 10 that includes only metal or a significant width of metal lines. When the interface structure 10 includes wide metal lines or patterns, the metal may experience significant dishing during chemical mechanical polishing (CMP) or other processing steps. Dishing of the metal lines can adversely affect ability to bond the metal lines of first semiconductor element 3 to the second semiconductor element 2, particularly when employing direct metal-to-metal bonding techniques. Accordingly, in various embodiments, the interface structure 10 can include one or more conductive interface features 12 embedded with or otherwise adjacent to one or more non-conductive interface features 14. The conductive interface features can provide an effective barrier so as to prevent or reduce the permeation of unwanted materials into the cavity 5 and/or to the integrated device 4 and/or to prevent or reduce the permeation of wanted gases filled in the cavity 5 to outside. Moreover, the conductive interface features can be made sufficiently thin and can be interspersed or embedded with the non-conductive interface features so as to reduce or eliminate the deleterious effects of dishing.

In some embodiments disclosed herein, the interface structure 10 can be defined by first interface features on the first semiconductor element and second interface features on the second semiconductor element. The first interface features (including conductive and non-conductive features) can be bonded to the corresponding second interface features to define the interface structure 10. In some embodiments, the interface structure 10 can comprise a separate structure that is separately bonded to the first semiconductor element 3 and the second semiconductor element 2. For example, in some embodiments, the wall 6 may be provided as a separate open frame with a generally planar semiconductor element 3 provided facing the frame. A second interface structure (not shown) can comprise an intervening structure that is directly bonded without an intervening adhesive between the open frame and semiconductor element 3 thereby forming a similar enclosed cavity 5 to that shown in FIG. 1A. The interface structure(s) 10 may provide mechanical and/or electrical connection between the first and second semiconductor elements 3, 2. In some embodiments, the interface structure 10 may provide only a mechanical connection between the elements 3, 2, which can act to seal the cavity 5 and/or the integrated device 4 from the outside environs. In other embodiments, the interface structure 10 may also provide an electrical connection between the elements 3, 2 for, e.g., grounding and/or for the transmission of electrical signals. In other embodiments, the interface structure 10 may provide an optical connection between the elements 3, 2. As explained in more detail below in connection with FIGS. 3A-3C, the conductive interface features can be direct bonded to one another without an intervening adhesive and without application of external pressure or a voltage. For example, bonding surfaces (e.g., bonding layers 11) of first and second interface features can be prepared. The bonding surfaces can be polished or planarized, activated, and terminated with a suitable species. For example, in various embodiments, one or both the bonding surfaces may comprise silicon based dielectric materials for example, silicon oxide. The bonding surfaces can be polished to a root-mean-square (rms) surface roughness of less than 2 nm, e.g., less than 1 nm, less than 0.5 nm, etc. The polished bonding surfaces can be activated by for example, a process comprising atmospheric or vacuum plasma method. In various embodiments, the bonding surfaces can be terminated with nitrogen, for example, by way of wet or dry etching (e.g., very slight etching (VSE)) using, for example, a nitrogen-containing solution or by using a plasma etch with nitrogen. As explained herein, the bonding surfaces can be brought into contact to form a direct bond at room temperature without application of external pressure. In some embodiments, the semiconductor elements 3, 2 can be heated to a higher temperature to strengthen the bond, for example, a bond between the non-conductive features. The semiconductor elements 3, 2 can be heated further to improve the bond strength between the opposing bonding surfaces of semiconductor 3 and 2 and to form reliable electrical and mechanical contact at interface 10 between the semiconductors 3 and 2. Additional details of the direct bonding processes used in conjunction with each of the disclosed embodiments may be found throughout U.S. Pat. Nos. 7,126,212; 8,153,505; 7,622,324; 7,602,070; 8,163,373; 8,389,378; 7,485,968; 8,735,219; 9,385,024; 9,391,143; 9,431,368; 9,953,941; and 10,032,068, and throughout U.S. Patent Application Publication No. 2017/0200711, the contents of each of which are hereby incorporated by reference herein in their entirety and for all purposes. In some embodiments, the conductive interface features of both elements 3, 2 and the non-conductive interface features of both elements 3, 2 are simultaneously directly bonded to one another.

It should be appreciated that, although the illustrated embodiment is directed to a MEMS bonded structure, any suitable type of integrated device or structure can be used in conjunction with the disclosed embodiments. For example, in some embodiments, the first and second semiconductor elements can comprise integrated device dies, e.g., processor dies and/or memory dies. In addition, although the disclosed embodiment includes the cavity 5, in other arrangements, there may not be a cavity. For example, the embodiments disclosed herein can be utilized with any suitable integrated device or integrated device die in which it may be desirable to seal active components from the outside environs, gases, liquids, plasma or unwanted materials. Moreover, the disclosed embodiments can be used to accomplish other objectives. For example, in some arrangements, the disclosed interface structure 10 can be used to provide an electromagnetic shield to reduce or prevent unwanted electromagnetic radiation from entering the structure 1, and/or to prevent various types of signal leakage. Of course, the cavity may be filled with any suitable fluid, such as a liquid, gas, or other suitable substance which may improve the thermal, electrical or mechanical characteristics of the structure 1.

FIGS. 1B-1K are schematic, partial, sectional plan views of various embodiments of the interface structure 10. It will be understood that the illustrated patterns can extend completely annularly or incompletely annularly (e.g., mostly annularly), around the protected region, such as the cavity 5 of FIG. 1A, to define an effectively annular or effectively closed profile. As used herein, effectively annular structures may include round annular structures, as well as non-rounded annular structures that define an effectively closed profile (e.g., square or other polygon). As shown in FIGS. 1B-1K, the interface structure 10 can comprise one or a plurality of conductive interface features 12 and one or a plurality of non-conductive interface features 14. As shown in FIG. 1A, the conductive and non-conductive features 12, 14 can extend vertically through portions of the first and/or second semiconductor elements 3, 2, e.g., vertically through portions of the bonding layer 11. For example, the conductive and non-conductive features 12, 14 can extend vertically through the first and/or second semiconductor elements 3, 2 (e.g., in a direction non-parallel or perpendicular to the major surface of the semiconductor elements 3, 2) by a vertical distance of at least 0.05 microns, at least 0.1 microns, at least 0.5 microns, or at least 1 micron. For example, the conductive and non-conductive features 12, 14 can extend vertically through the first and/or second semiconductor elements 3, 2 by a vertical distance in a range of 0.05 microns to 5 microns, in a range of 0.05 microns to 4 microns, in a range of 0.05 microns to 2 microns, or in a range of 0.1 microns to 5 microns. By extending the conductive and non-conductive features 12, 14 through portions of the first and/or second semiconductor elements 3, 2, the conductive and non-conductive features 12, 14 can provide a seal without gaps between the semiconductor elements 3, 2 and the interface structure 10. The conductive and non-conductive features 12, 14 provided on semiconductor elements 3, 2 may provide generally planar surfaces for bonding the two semiconductor elements.

The conductive interface feature 12 can comprise any suitable conductor, such as a metal. For example, the conductive interface feature 12 can comprise copper, aluminum, nickel, tungsten, titanium, tantalum or their various alloys or any other suitable metal that is sufficiently impermeable to fluids/gases, such as air, hydrogen, nitrogen, water, moisture, etc. The non-conductive interface feature 14 can comprise any suitable non-conductive material, such as a dielectric or semiconductor material. For example, the non-conducive interface feature 14 can comprise silicon oxide in some embodiments. In other embodiments, the non-conducive interface feature 14 can comprise silicon nitride, silicon carbide or silicon carbonitride. Although only one layer of non-conductive interface 14 is shown in FIG. 1A, it is understood that it may comprise one or more layers of non-conductive materials. For example, one or more layers of silicon oxide, silicon nitride, etc. Beneficially, the use of both a conductive interface feature 12 and a non-conductive interface feature 14 can provide improved sealing to prevent unwanted materials from passing from the outside environs into the cavity 5 and/or to the device 4. As explained above, conductors such as metals may generally provide improved sealing for many gases. However, some non-conductive materials (e.g., dielectrics) may be less permeable to certain gases than conductors, metals, or semiconductors. Structurally mixing the conductive features 12 with the non-conductive features 14 may provide a robust seal to prevent many different types of unwanted materials such as gases, plasma, inorganic ions and fluids from entering the cavity and/or affecting the performance of the device 4.

In the embodiment of FIG. 1B, only one conductive interface feature 12, which may be completely annular, is provided. The conductive interface feature 12 can be embedded in one or more non-conductive interface features 14 to define an effectively annular or effectively closed profile. For example, in some embodiments, the conductive interface feature 12 can be embedded in a bulk non-conductive material. In other applications the conductive interface feature 12 can be embedded in more than one layer (not shown). For example, a top portion of the conductive interface feature 12 may be embedded in the non-conductive interface feature 14 and a lower portion of the conductive interface feature 12 embedded in a different material. The different material below the non-conductive feature 14 may comprise a semiconductor material or other suitable materials. In other embodiments, layers of non-conductive material can be provided on one or opposing sides of the conductive interface feature 12. As shown in FIG. 2A, the conductive interface feature 12 can extend around the cavity 5 and/or the integrated device 4 in a completely annular pattern. In FIG. 2A, for example, the conductive interface feature 12 extends in a complete annulus, or closed shape, about the cavity 5 and/or device 4, such that the non-conductive material of the non-conductive feature 14 does not cross or intersect the conductive interface feature 12. In other embodiments, however (for example, see description of FIGS. 2D and 2E below), there may be one or more gaps between portions of the conductive interface feature 12, but without a direct path to the cavity 5. Individual elements of the conductive interface feature 12 can be incompletely annular in some embodiments. For example, individual elements of the conductive interface feature 12 can be mostly annular, e.g., extend about the cavity 5 and/or the integrated device 4 by at least 90°, at least 180°, at least 270°, at least 350°, or at least 355° (e.g., 360°), while cooperating to define an effectively annular or closed interface structure 10. Further, as explained above, the conductive interface feature 12 can extend vertically into and can be embedded in portions of the wall 6 and/or corresponding portions of the second semiconductor element 2.

The structure of FIG. 1A, including any of the example patterns of FIGS. 1B-1K, can be formed, for example, by semiconductor fabrication techniques, such as by forming metal lines on a substrate by deposition, patterning and etching and depositing oxide thereover, or by damascene or dual damascene processing. Desirably, the metal lines to be bonded are formed flush with surrounding non-conductive material, or slightly (e.g., 0.5 nm to 20 nm) recessed or protruding from the non-conductive material. Annular or mostly annular patterns of metal lines can be formed on both semiconductor elements 3, 2 using semiconductor processing, for directly bonding to one another and creating an effective metal seal against gas diffusion.

The interface structure 10 can have an interface width $t_0$ in a range of 1 micron to 1 mm. The conductive interface feature 12 can have a conductor width $t_c$ in a range of 0.1 microns to 50 microns. As explained above, the interface structure 10 disclosed in FIG. 1B can beneficially provide an effective seal against gases entering the cavity 5 and/or interacting with the device 4 or the gases exiting the cavity to outside. Moreover, the interface structure 10 disclosed herein can be thinner than other types of bonds or interfaces, which can advantageously reduce the overall package footprint.

Turning to FIG. 1C, the interface structure 10 can include a plurality of conductive interface features 12 and an intervening solid state (e.g., non-gaseous) non-conductive interface feature 14 disposed between adjacent conductive interface features 12. FIG. 2C is a schematic plan view of the interface structure 10 shown in FIG. 1C. As with the implementation of FIG. 1B, the interface structure 12 can be disposed about the integrated device 4 and can comprise conductive features 12 arranged in an effectively annular or closed profile (e.g., a complete or incomplete annulus in various arrangements) to connect the first semiconductor element 3 and the second semiconductor element 2. In FIGS. 1C and 2C, the conductive features 12 comprise at least one complete or absolute annulus. In other embodiments, the conductive features can be shaped differently, but can be arranged to define an effectively annular or closed profile. The use of multiple conductive features 12 can provide multiple layers of highly impermeable material so as to reduce the inflow of unwanted materials into the cavity 5 and/or outflow of gases or wanted materials from the cavity 5 to outside. Utilizing multiple thin conductive features 12 spaced by the non-conductive features 14, compared to wider features, can reduce the effects of dishing due to polishing for a given degree of overall impermeability. Thus, in various embodiments, multiple conductive features 12 can be arranged around one another, for example concentrically, mostly or completely about the device 4 and/or the cavity 5 to provide an effective gas seal. In some embodiments, a width of one of the non-conductive features 14 disposed between the adjacent conductive features 12 can be less than 10 times the width $t_c$ of one of the multiple conductive features 12, and preferably less than 5 times the width $t_c$ of the conductive feature. Also, a length of the multiple conductive features 12 and/or the non-conductive features 14 can be at least 10 times a width of the interface structure.

Moving to FIG. 1D, in some embodiments, the conductive interface features 12 can comprise a plurality of annular conductors 12A disposed about the cavity 5 and/or device 4 in an effectively annular or closed pattern, and a plurality of crosswise conductors 12B connecting adjacent annular conductors 12A. Advantageously, the use of annular and crosswise conductors 12A, 12B can provide increased contact area for implementations that utilize direct bonding (explained below), can simplify CMP process by, for example, creating more uniform distribution of conductive features 12 and non-conductive features 14, and can provide an improved gas seal due to the beneficial permeation properties of the conductive material. As with the embodiments of FIGS. 1B-1C, in FIG. 1D, the conductive interface features 12 can delimit a closed loop such that the non-conductive features 14 do not intersect or cross the conductive features 12.

FIGS. 1E-1G illustrate conductive interface features 12 having a kinked, annular profile, in which a plurality of conductive segments 112a-112c are connected end-to-end and angled relative to adjacent segments. As with the embodiments of FIGS. 1B-1D, the features 12 can be disposed about the cavity 5 and/or device 4 in an effectively annular or closed pattern, e.g., in a complete annulus. The kinked profiles illustrated in FIGS. 1E-1G can comprise a first segment 112a and a second segment 112c spaced apart from one another in a transverse direction. The first and second segments 112a, 112c can be connected by an intervening transverse segment 112b. The first and second segments 112a, 112c can be oriented along a direction generally parallel to the at least partially annular pathway around the cavity 5 and/or integrated device 4. The transverse segment 112b can be oriented transverse or non-parallel to the first and second segments 112a, 112c. In some embodiments, the non-conductive interface features 14 may not cross the conductive features 12.

The kinked annular profile of the conductive interface features 12 can facilitate direct bonding with increased tolerance for misalignment in various implementations, as compared with features 12 that are straight or non-kinked, while maintaining the benefits of narrow lines with respect to the effects of dishing after polishing. For example, the zig-zag or kinked pattern may promote contact between misaligned contact structures on the two elements, in various embodiments. Moreover, the kinked profile may reduce the effects of dishing after chemical mechanical polishing (CMP), because the segments 112a and 112c may be shorter along the length of the conductive features, as compared with conductive features that extend continuously around the interior of the bonded structure. The kinked profile can include any number of conductive interface features 12. For example, FIG. 1E illustrates a kinked profile with a single conductive interface feature 12. FIG. 1F illustrates a plurality of conductive interface features 12 spaced apart transversely by an intervening non-conductive interface feature 14. As with FIG. 1D, in FIG. 1G, spaced apart annular conductors 12A can be joined by crosswise conductors 12B. Skilled artisans would appreciate that other patterns may be suitable.

FIGS. 1H-1K illustrate conductive interface features 12 having an irregular or zigzag annular profile, in which a plurality of conductive segments 112a-112f are connected end-to-end and angled relative to adjacent segments by way of one or more bend regions 11. As shown in FIGS. 1H-1K, the segments 112a-112f may be arranged in an irregular pattern, in which the segments 112a-112f are angled at different orientations and/or have different lengths. In other arrangements, the segments 112a-112f may be arranged in a regular pattern at angles that are the same or periodic along the annular profile. In still other arrangements, the conductive features 12 can be curved or otherwise non-linear. These features may also increase tolerance for misalignment, relative to straight line segments, while still employing relatively narrow lines that are less susceptible to dishing and therefore earlier to employ in direct metal-to-metal bonding.

Figure 2B:
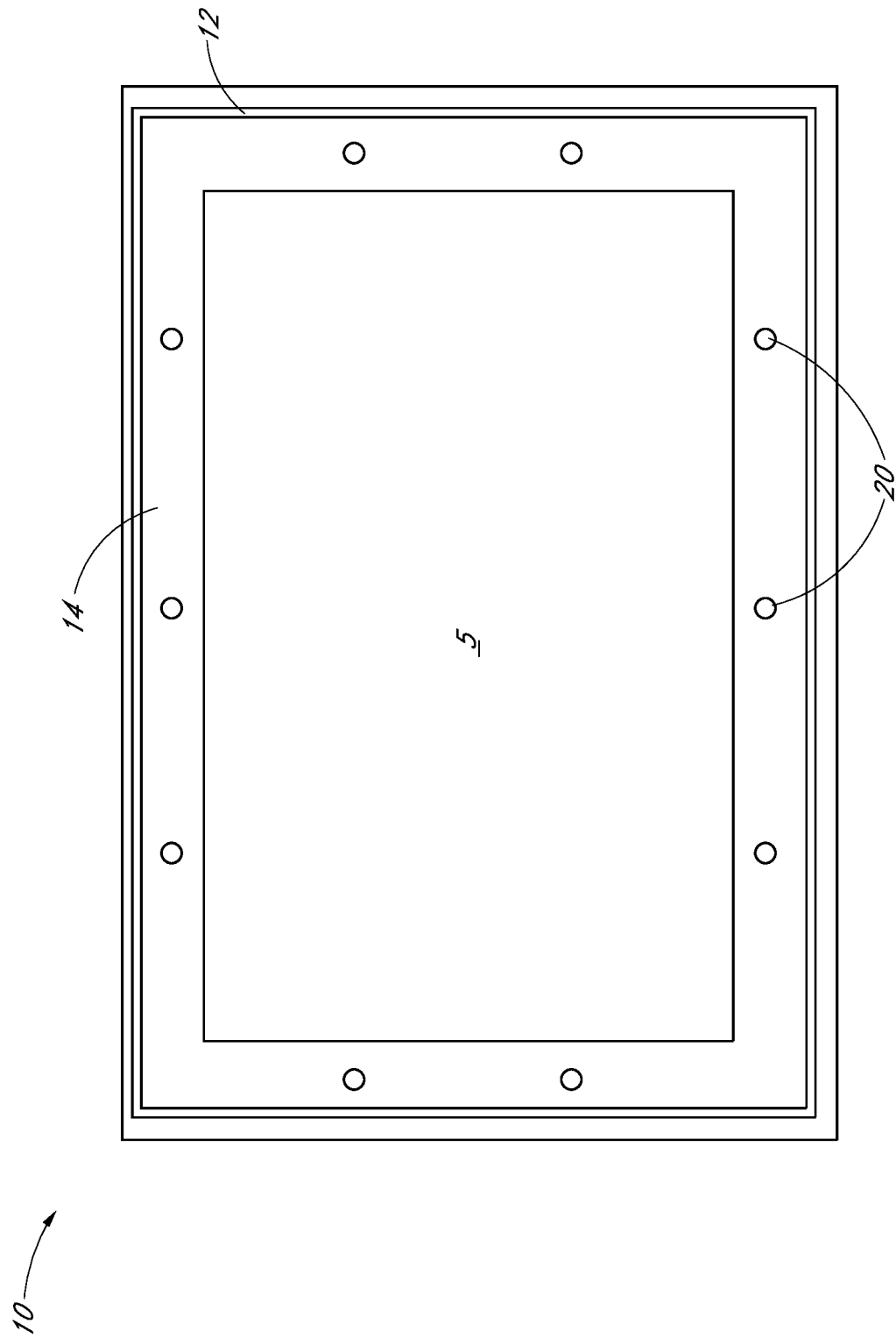
FIG. 2B is a schematic sectional plan view of an interface structure having one or more electrical interconnects extending through the bonded interface.
Figure 2C:
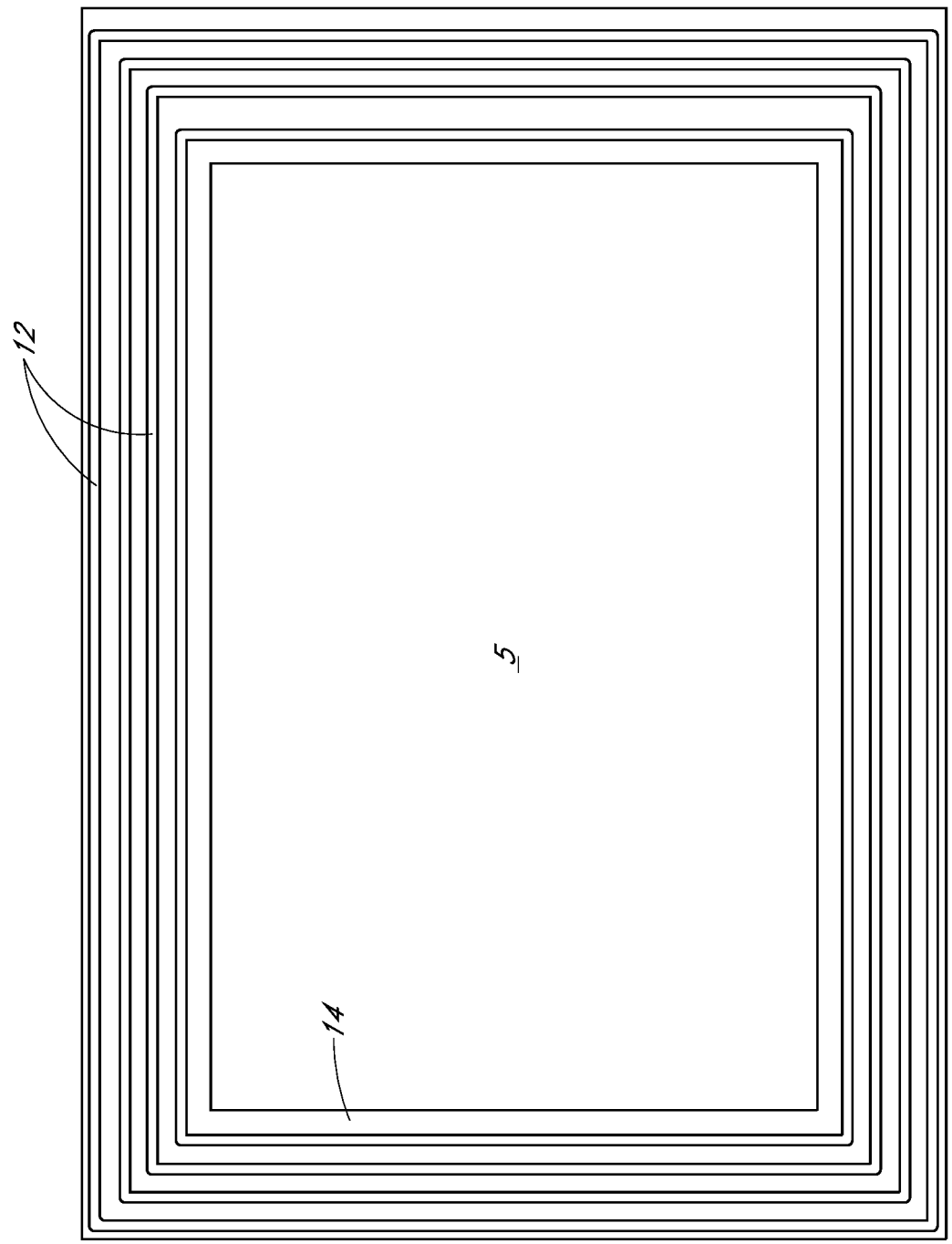
FIG. 2C is a schematic sectional plan view of the interface structure of FIG. 1C.

FIG. 2B is a schematic sectional plan view of an interface structure 10 having one or more electrical interconnects extending through the interface structure 10. As with FIG. 2A, the conductive feature(s) 12 can be disposed within the interface structure 10 about the cavity 5 and/or integrated device 4 to define an effectively annular or closed profile, e.g., a completely annular profile. The conductive feature(s) 12 can comprise elongate feature(s) with a length greater than a width (e.g., with a length of at least five times the width, or at least ten times the width). Unlike the interface structure 10 shown in FIG. 2A, however, the interface structure 10 of FIG. 2B includes one or a plurality of electrical interconnects 20 extending vertically partially or fully through one or more non-conductive interface features 14. The electrical interconnect 20 can be in electrical communication with the integrated device 4 and/or other components of the bonded structure 1 so as to transfer power or signals between the various components of the structure 1. In some embodiments, the electrical interconnect 20 can extend from the first semiconductor element 3 to the second semiconductor element 2. As shown in FIG. 2B, the electrical interconnect 20 can be spaced inwardly and electrically separated from the conductive interface feature 12, which itself can also serve to electrically connect circuits in the first and second semiconductor elements 3, 2. In other embodiments, the electrical interconnect 20 can be spaced outwardly from the conductive interface feature 12. In still other embodiments, as explained below, the electrical interconnect 20 can extend through intervening non-conductive interface features 14 disposed between a plurality of conductive interface features 12.

The electrical interconnects 20 can provide electrical communication between the semiconductor elements 3, 2 through the interface structure 10. Providing the interconnects 20 in a direction non-parallel or transverse to the interface structure 10 can therefore enable the interface structure 10 to act as both a mechanical and electrical connection between the two semiconductor elements 3, 2. The interconnects 20 can comprise any suitable conductor, such as copper, gold, tungsten, titanium, tin, etc. The interconnects 20 can comprise conductive traces or through-silicon vias in various arrangements. Moreover, as noted above, the interface features 12 may also serve as annular or mostly annular electrical interconnects, with or without the conventional interconnects 20.

FIG. 2D is a schematic sectional plan view of an interface structure 10 having a plurality of conductive interface features 12A, 12B disposed about a cavity 5 to define an effectively annular or closed profile, with each conductive interface feature 12A, 12B comprising an incompletely annular feature, e.g., a mostly annular feature extending more than 180°. For example, as shown in FIG. 2D, each conductive interface feature 12A, 12B can comprise a U-shaped structure, with the feature 12B disposed inwardly relative to the feature 12A by a non-conductive gap 39. Thus, in FIG. 2D, each conductive interface feature 12A, 12B may comprise a mostly annular profile, but with the gap 39 between the two interface features 12A, 12B such that any one of the interface features 12A, 12B does not necessarily define a closed loop. The structure 10 shown in FIG. 2D may still be effective at reducing the permeation of gases into cavity 5 and/or device 4, since the pattern of conductive interface features 12A, 12B combine to create an effectively annular or effectively closed structure about the cavity 5. Some gas may permeate through the gap 39, but the gas would have a very long path through the non-conductive material before it could reach the cavity 5 and/or contact the device 4, so as to overcome the higher diffusivity of gases in the non-conductive material 14 relative to the conductive material of the conductive interface features 12A, 12B. It should be appreciated that although two features 12A, 12B are shown herein, any suitable number of features 12 can be used. The conductive interface feature 12A may be connected with the conductive interface feature 12B by, for example, a gap bridging conductive interface feature 12C. In some embodiments, multiple gap bridging conductive interface features 12C may connect interface feature 12A and interface feature 12B to form an intertwining sealing structure at the bonding surface 10. The gap bridging conductive interface features 12C may be spaced with intervals. The intervals may be symmetrical or non-symmetrical over the bonding surface.

Figure 2E:
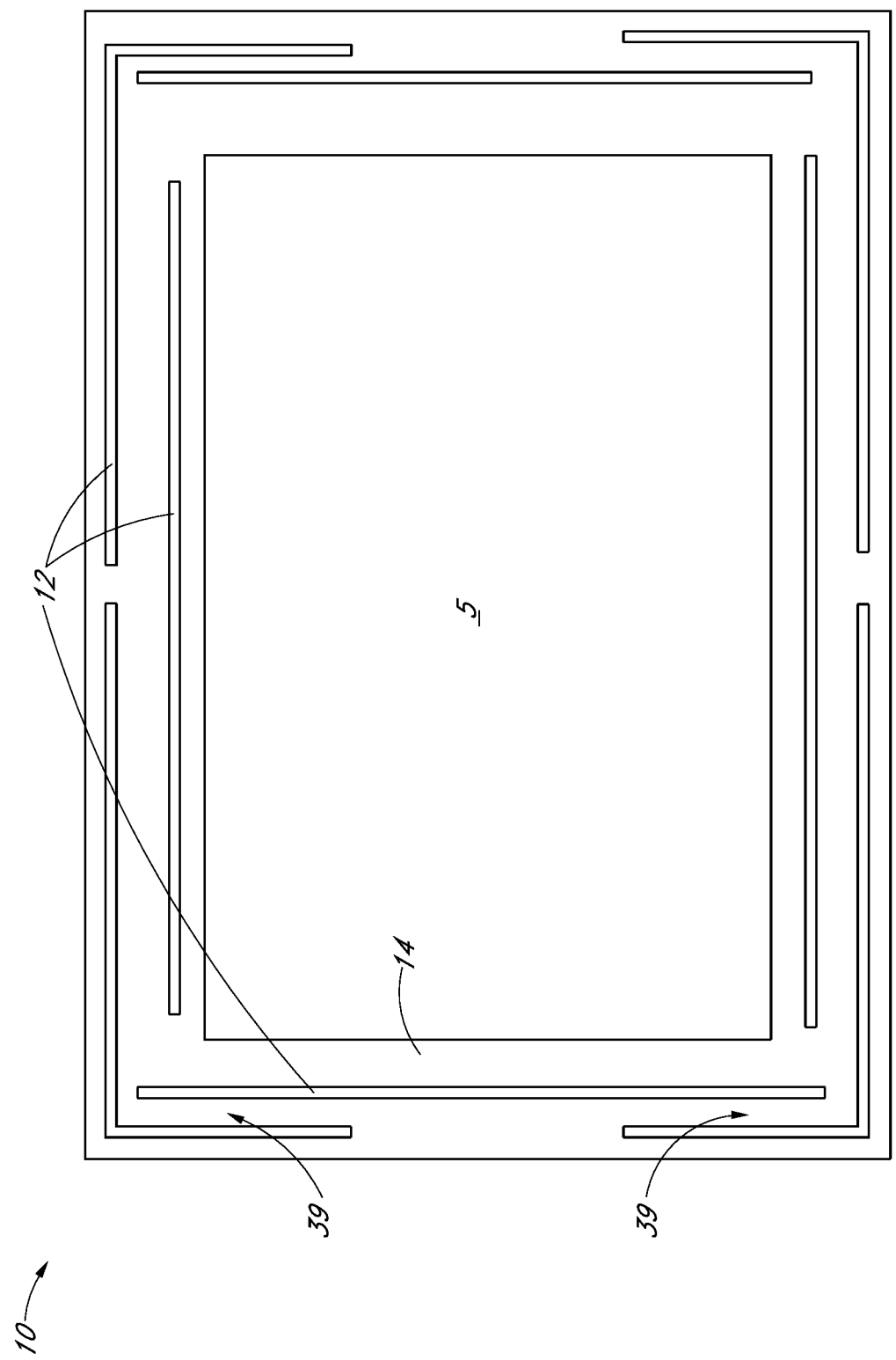
FIG. 2E is a schematic sectional plan view of an interface structure having a plurality of conductive interface features disposed about a cavity to define an effectively annular profile, wherein the plurality of conductive features comprises a plurality of segments spaced apart by gaps.

FIG. 2E is a schematic sectional plan view of an interface structure 10 having a plurality of conductive interface features 12 disposed about a cavity 5 to define an effectively annular or closed profile, wherein the plurality of conductive features 12 comprises a plurality of segments spaced apart by non-conductive gaps 39. The segments that define each conductive interface feature 12 shown in FIG. 2E comprise linear segments, but in other embodiments, the segments can be curved. In FIG. 2E, some or all conductive interface features 12 on their own may not define a mostly annular pattern. Taken together, however, the pattern defined by the illustrated arrangement of conductive interface features 12 may define an effectively annular or closed pattern. Thus, even though a particular conductive interface feature 12 may not be annular, the arrangement of multiple conductive interface features 12 can define an effectively annular or closed pattern to seal an interior region of the bonded structure from gas entering the interior region from the outside environs, as shown in FIG. 2E. As shown in FIG. 2D, the embodiment shown in FIG. 2E may also include a gap bridging conductive interface feature that connects the plurality of conductive features 12. In some embodiments, for example, as shown in FIGS. 2D and 2E, multiple patterns of conductive interface features 12, 12A, 12B may be applied to form a maze-like structure including a plurality of turns. The maze-like structure can be a convoluted maze with or without the gap bridging conductive interface feature 12C, in some embodiments.

The embodiments of FIGS. 2A-2E can accordingly comprise interface structures 10 that include conductive and non-conductive interface features 12, 14 that collectively define an effectively annular or closed diffusion barrier. For example, a particular conductive interface feature 12 can comprise a complete annulus or an incomplete annulus (e.g., mostly annular) that is arranged with other conductive and non-conductive interface features so as to define an effectively annular pattern or diffusion barrier. In some embodiments, the conductive interface feature can comprise other shapes, such as straight or curved segments, that are arranged about the cavity 5 and/or device 4 so as to define an effectively annular pattern or diffusion barrier. Moreover, the embodiments of FIGS. 2D and 2E can advantageously provide multiple conductive segments that can each serve as separate electrical connections, for example, for separate signal line connections, ground line connections and power line connections. Together those segments can provide effectively annular conductive patterns to serve as diffusion barriers. The effectively annular patterns described herein can beneficially provide a longer distance over which gases travel to reach the sensitive components of the structure 1, which can reduce the permeability of the structure 1. In some embodiments, the width of the non-conductive feature 14 disposed between adjacent conductive feature 12A and 12B can be less than 10 times the width $t_c$ of conductive feature 12A or 12B, and preferably less than 5 times the width $t_c$ of the conductive features 12. Also, the length of the conductive features 12 and/or the non-conductive features 14 can be at least 10 times the width of the conductive and non-conductive features.

Figure 2F:
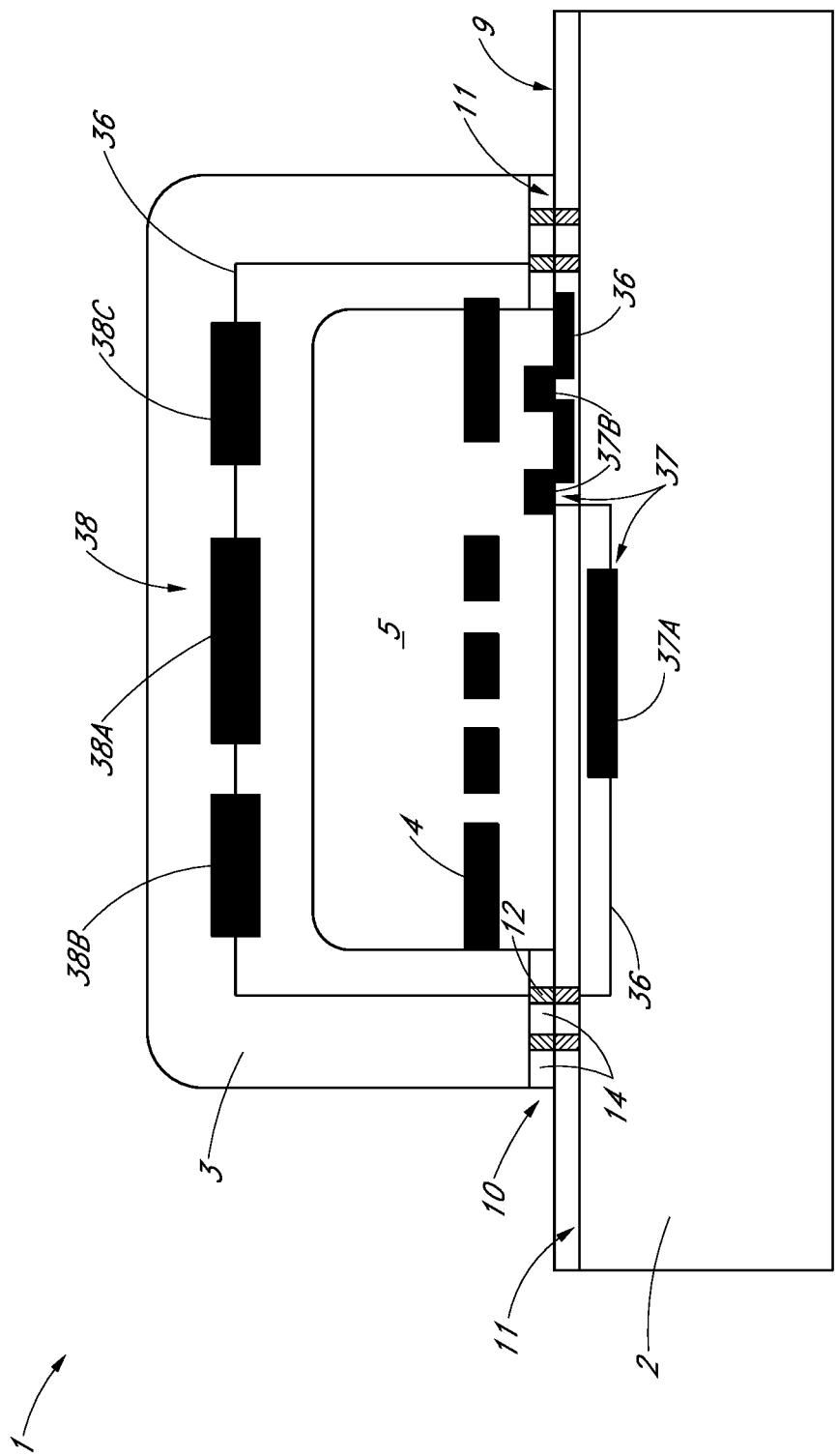
FIG. 2F is a schematic side sectional view of a bonded structure, according to some embodiments.

FIG. 2F is a schematic side sectional view of a bonded structure 1, according to some embodiments. FIG. 2F is similar to FIG. 1A, except in FIG. 2F, the first semiconductor element 3 can comprise one or a plurality of electronic components 38 formed or coupled with various portions of the semiconductor element 3. For example, as illustrated, the semiconductor element 3 can comprise a plurality of electronic components 38A-38C. The electronic components 38A-38C can comprise any suitable type of electronic component. The electronic components 38 can comprise any suitable type of device, such as integrated circuitry (e.g., one or more transistors) or the like. In some embodiments, the electronic components 38 can communicate with the device 4, the second semiconductor element 2, and/or other components by way of the interconnects (see FIG. 2B) and/or by the conductive interface features 12. For example, the electronic components 38 can communicate with the second semiconductor element 2 by way of one or more conductive traces 36 that pass through the semiconductor element 3. The electronic components 38 and the traces 36 can be defined by semiconductor processing techniques, such as deposition, lithography, etching, etc. and can be integrated with the semiconductor element 3. The traces, for example, may be formed by conventional back-end-of-line interconnect metallization through multiple metal levels. Moreover, as shown in FIG. 2F, any of the embodiments disclosed herein can include one or a plurality of electronic components 37 formed (e.g., with semiconductor processing techniques) or coupled with the second semiconductor element 2. The electronic components 37 can comprise any suitable type of device, such as integrated circuitry or the like, and can communicate with the device 4, the first semiconductor element 3, and/or other components. For example, in some embodiments, one or more electronic components 37A can be defined within the semiconductor element 2 (e.g., buried within the semiconductor element 2 or exposed at the surface 9). In some embodiments, one or more electronic components 37B can be defined at, on or above the surface 9 of the semiconductor element 2.

In some embodiments, the electronic components 37, 38 may not be in electrical contact with the conductive interface features 12. In such embodiments, the conductive interface features 12 may be used, for example, primarily for bonding the elements 2, 3. In some embodiments, the electronic components 37, 38 may be in electrical connection with the device 4 via, for example, conductive lines through the elements 2, 3. In some embodiments, one or more of the electronic components 37, 38 may be outside of the cavity 5. In some embodiments, one or more of the electronic components 37, 38 may be disposed outside of the conductive interface features 12.

Figure 2G:
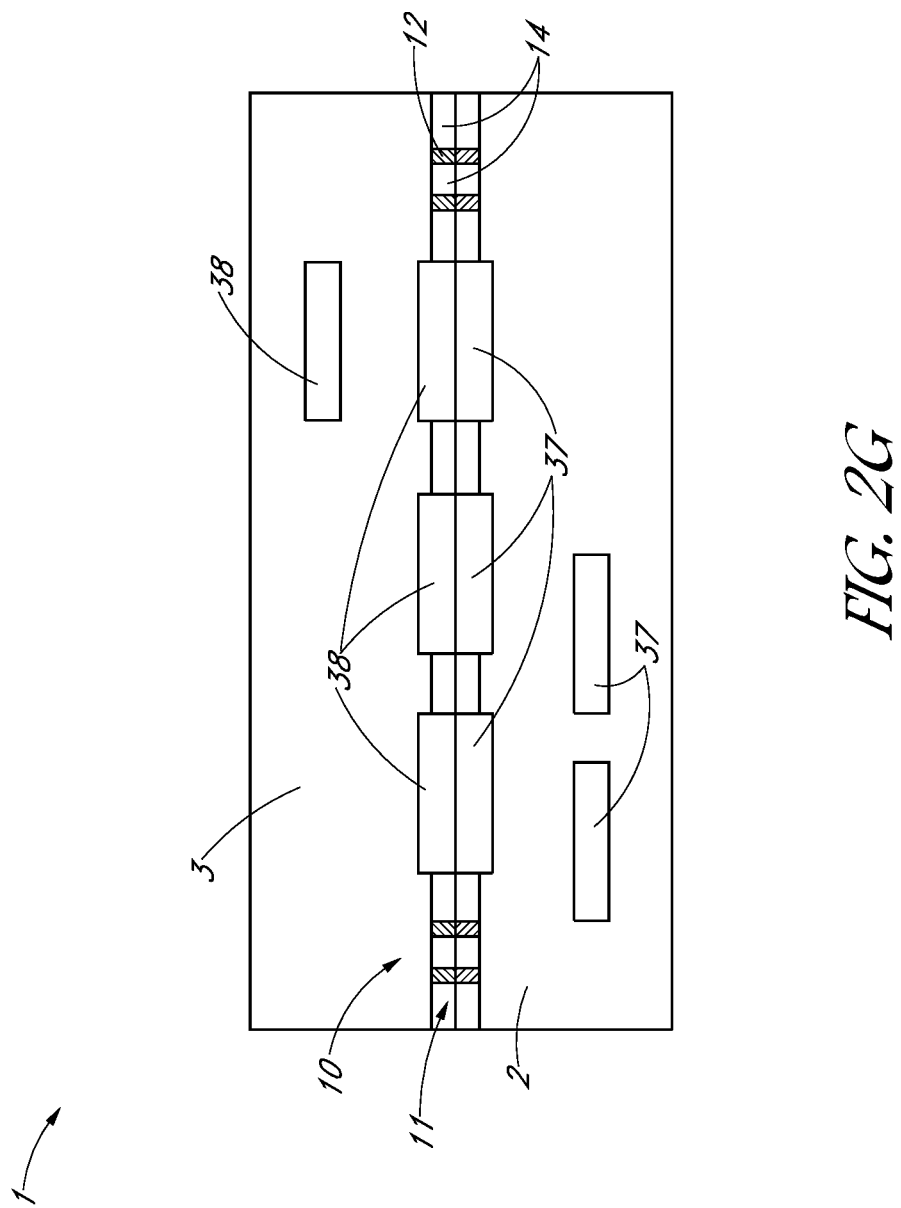
FIG. 2G is a schematic side sectional view of a bonded structure, according to various embodiments.

FIG. 2G is a schematic side sectional view of a bonded structure 1, according to various embodiments. FIG. 2G is similar to FIGS. 1A and 2F, except in FIG. 2G, there may not be a cavity defined between the first and second semiconductor elements 3, 2. Rather, in the embodiment of FIG. 2G, the first and second semiconductor elements 3, 2 may be bonded to one another without an intervening cavity. In the illustrated embodiment, as with the embodiments described herein, the semiconductor elements 3, 2 can be bonded to one another by way of an interface structure 10 that defines an effectively annular pattern or profile about the interior of the elements 3, 2. As explained herein, the semiconductor elements 3, 2 can be directly bonded to one another along at least the interface structure 10 to define the effectively annular profile, with conductive and nonconductive interface features defined therein. The effectively annular profile of the interface structure 10 can comprise any of the patterns disclosed herein. Even though there may be no cavity in the bonded structure 1 of FIG. 2G, the interface structure 10 may define an effective seal so as to protect sensitive electronic circuits or components 37 in the interior of the structure 1 from the outside environs, including, e.g., gases. It should be appreciated that any of the embodiments disclosed herein may be used in conjunction with bonded structures that do not include a cavity.

Moreover, as illustrated in FIG. 2G, the first semiconductor element 3 can comprise one or more electronic components 38 formed at or near the surface of the element 3, and/or within the body of the element 3. The second semiconductor element 2 can also include one or more electronic components 37 formed at or near the surface of the element 2, and/or within the body of the second semiconductor element 2. The electronic components 37, 38 can comprise any suitable type of element, such as electronic circuitry that includes transistors, etc. The components 37, 38 can be disposed throughout the elements 3, 2 in any suitable arrangement. In the embodiment of FIG. 2G, the first and second elements 3, 2 can comprise any combination of device dies, such as any combination of processor dies, memory dies, sensor dies, passive elements etc. In the illustrated embodiment, the interface structure 10 can be disposed about the periphery of the bonded structure 1 so as to seal the interior of the bonded structure 1 from the outside environs. In various embodiments, therefore, the interior of the bonded structure 1, e.g., the region within the effectively annular pattern defined by the interface structure 10, may or may not be directly bonded. In the illustrated embodiment, some components 37, 38 may be disposed within an interior region of the bonded structure 1, e.g., within the effectively closed profile defined by the interface structure 10. A first interconnect of the first semiconductor element 3 and a second interconnect of the second semiconductor element 2 can be directly bonded to one another within the interior region of the bonded structure 1 to connect components 37, 38 in the respective elements 3, 2. In addition, additional components may be disposed outside the interior region defined by the interface structure 10. Such additional components (such as integrated device dies) may also be directly bonded to one another outside the interior region.

Figure 3A:
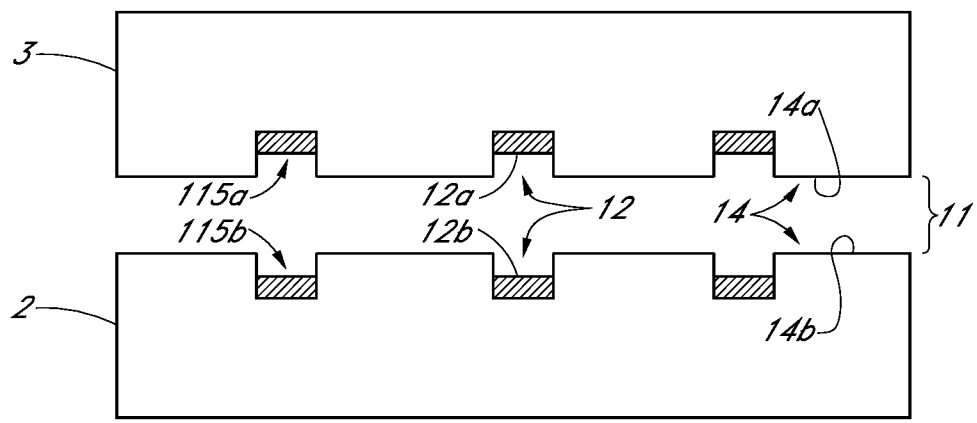
FIG. 3A is a schematic side cross-sectional view of a first semiconductor element and a second semiconductor element before the two elements are brought together.

FIG. 3A is a schematic side cross-sectional view of a first semiconductor element 3 and a second semiconductor element 2 before the two elements 3, 2 are brought together. The semiconductor elements 3, 2 can comprise respective bonding layers 11 that comprise conductive interface features 12 comprising first and second conductive contact features 12a, 12b, and non-conductive interface features 14 comprising first and second non-conductive interface features 14a, 14b. As shown in FIG. 3A, the conductive interface features (or contact features) 12a, 12b can be disposed below the upper and lower bonding surfaces 11 such that corresponding recessed spaces 115a, 115b are formed in the semiconductor elements 3, 2. The conductive features 12a, 12b can be formed in the recessed spaces 115a, 115b in any suitable manner. For example, in some embodiments, the recessed conductive features 12a, 12b can be formed using a damascene process. In such damascene processes, one or more trenches can be formed in the semiconductor element 3, 2 (e.g., by etching), and conductive material can be supplied, for example, by way of deposition, in the trenches. The conductive material over field regions can be polished or otherwise removed to as to form the recessed contact features 12a, 12b of FIG. 3A. As explained above, the conductive features 12a, 12b can comprise any suitable conductive material (e.g., copper (Cu)). The non-conductive features 14a, 14b can comprise any suitable nonconductive or dielectric material (e.g., silicon oxide). As explained above, the bonding surfaces 11 can be prepared for direct bonding. For example, the bonding surfaces 11 can be polished, very slightly etched, and/or terminated with a desired species (such as nitrogen). Additional details of the direct bonding processes used in conjunction with each of the disclosed embodiments may be found throughout U.S. Pat. Nos. 7,126,212; 8,153,505; 7,622,324; 7,602,070; 8,163,373; 8,389,378; 7,485,968; 8,735,219; 9,385,024; 9,391,143; 9,431,368; 9,953,941; and 10,032,068, and throughout U.S. Patent Application Publication No. 2017/0200711, the contents of each of which are hereby incorporated by reference herein in their entirety and for all purposes.

Figure 3B:
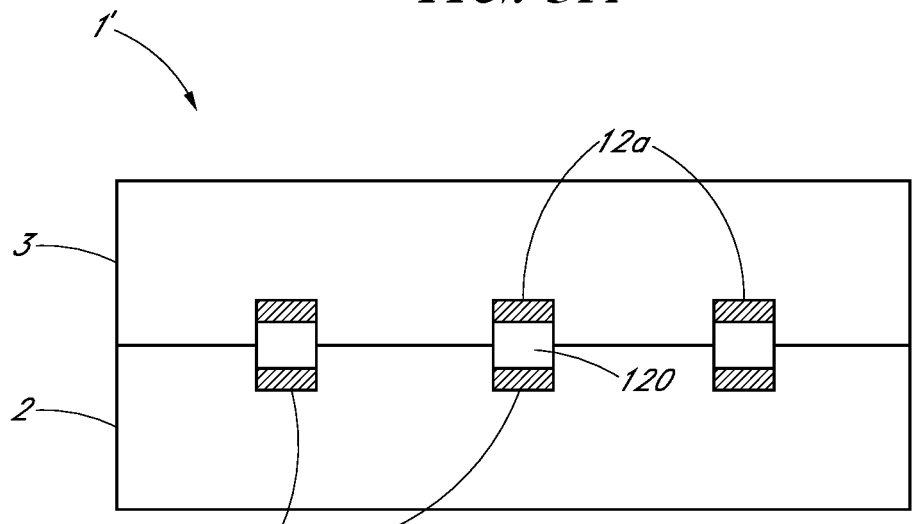
FIG. 3B is a schematic side cross-sectional view of an intermediate bonded structure after the bonding regions are directly bonded together.

FIG. 3B is a schematic side cross-sectional view of an intermediate bonded structure 1' after the non-conductive features 14a, 14b are directly bonded together. When the non-conductive features 14a, 14b are brought into contact, the non-conductive features 14a, 14b can be directly bonded together so as to form a chemical bond (e.g., a covalent bond) without an intervening adhesive. As explained above, the direct bonding can be conducted at room temperature and/or without the application of external pressure. After the non-conductive features 14a, 14b are directly bonded together, there may remain an initial gap 120 between the corresponding conductive features 12a, 12b. It will be understood that such a gap 120 can also be achieved after contacting the non-conductive features 14a, 14b even if the contacts on one side protrude.

Figure 3C:
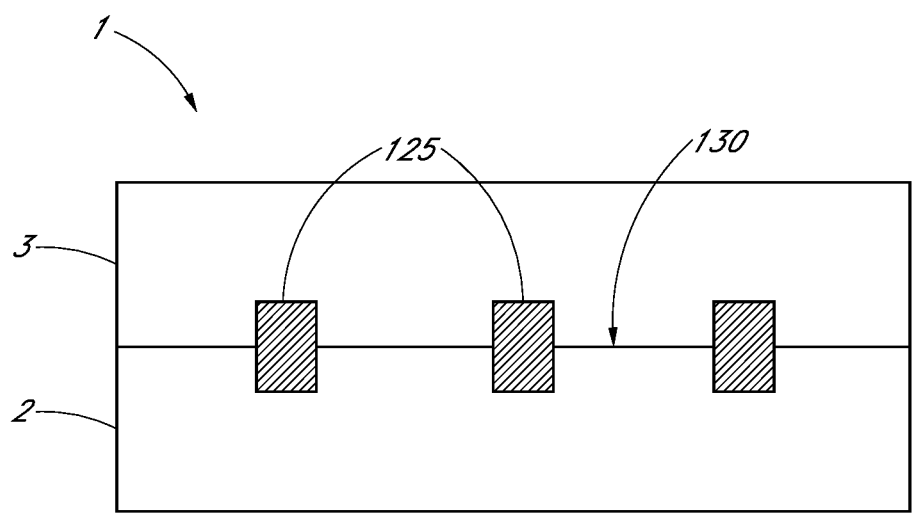
FIG. 3C is a schematic side cross-sectional view of a bonded structure after the contact features are directly bonded together.

FIG. 3C is a schematic side cross-sectional view of a bonded structure 1 after the conductive features 12a, 12b are directly bonded together. In various embodiments, for example, the semiconductor elements 3, 2 can be heated after directly bonding the non-conductive features 14a, 14b. In various embodiments, the semiconductor elements 3, 2 can be heated in a range of 75° C. to 350° C., or more particularly, in a range of 100° C. to 250° C. Heating the semiconductor elements 3, 2 may cause the conductive features 12a, 12b to expand to fill the gap 120. Thus, after the conductive features 12a, 12b are directly bonded together, a directly bonded contact 125 can substantially fill the void between the two semiconductor elements 3, 2.

As shown in FIG. 3C, the bonding surfaces 11 can be directly bonded along an interface 130. The interface 130 between the non-conductive features 14a, 14b can extend substantially to the first and second conductive features 12a, 12b, i.e., to the directly bonded contact 125. Thus, as shown in FIG. 3C, after the conductive features 12a, 12b are bonded together.

The distance of first and second conductive features 12a, 12b below the bonding surfaces 11 of the semiconductor elements 3, 2 can be less than 20 nm and preferably less than 10 nm. Bonding followed by temperature increase can cause the conductive features 12a, 12b to expand, which may make a physical contact between the conductive features 12a, 12b, and increase the compressive force between conductive features 12a, 12b as they expand further and with the compressive forces and available thermal energy opposing metal grains in 12a and 12b exhibit intergrowth, which results in improved metal bonding, metal contact, metal interconnect, or conductance between conductive structures 12. The slight distance of conductive features 12a, 12b below the respective bonding surfaces 11 can be an average distance over the extent of the conductive features 12. The topography of the conductive features 12 may also include locations equal, above, and below the average distance. The total height variation of the conductive features 12, given by the difference between the maximum and minimum height, may be substantially greater than the root-mean-square (RMS) variation. For example, a conductive feature with a RMS of 1 nm may have a total height variation of 10 nm.

Accordingly, although conductive features 12a, 12b may be slightly below the bonding surfaces 11, a portion of conductive features 12a, 12b may extend above the bonding surfaces 11, resulting in a mechanical connection between the conductive features 12a, 12b after bonding of the bonding surfaces 11. This mechanical connection may not result in an adequate electrical connection between conductive features 12a, 12b due to an incomplete or non-uniform mechanical connection or native oxide or other contamination on conductive features 12a, 12b. Subsequent temperature increase may improve the metal bonding, metal contact, metal interconnect, and/or conductance between conductive features 12a, 12b as described above.

Alternatively, the temperature increase may result in mechanical contact and/or desired electrical interconnection between conductive features 12a, 12b if the highest portion of conductive features 12a, 12b is below bonding surfaces 11 and there is not a mechanical contact between conductive features 12a, 12b after bonding.

Alternatively, conductive features 12a may be recessed below the bonding surface 11 of the first element 3 and conductive features 12b may protrude above bonding surface 11 of the second element 2, or conductive features 12a may protrude above the bonding surface 11 of the first element 3 and conductive features 12b may be recessed below the bonding surface 11 of the second element 2. Alternatively, the difference between the distances of the recessed conductive features 12a, 12b below the bonding surfaces 11 can be nominally zero or slightly negative. In some embodiments, the slightly negative recess may be preferable. A post-bond temperature increase may improve the metal bonding, metal contact, metal interconnect, conductance between conductive features 12a, 12b via intergrowth of opposing grains as described above.

The height or depth of, for example, a protrusion or a recess of conductive features 12a, 12b relative to the bonding surfaces 11 of elements 3, 2 can be controlled with a polishing process that forms the surfaces of elements 3, 2, for example using chemical mechanical polishing (CMP). The CMP process typically may have a number of process variables including but not limited to the type of polishing slurry, rate of slurry addition, polishing pad, polishing pad rotation rate, and polish pressure. The CMP process can be further dependent on the specific non-metal and metal materials comprising the semiconductor elements 3, 2, and the relative polishing rates of non-metal and metal materials comprising the bonding surfaces 10. Alternate polishing techniques, for example slurry-less polishing, may also be used.

The height or depth of conductive features 12a, 12b relative to the bonding surfaces 11 may also be controlled with a slight dry etch of the material around conductive features 12a, 12b on the surfaces of semiconductor elements 3, 2, for example using a plasma or reactive ion etch using a mixture of $CF_4$ and $O_2$, for the surfaces comprised of certain dielectric materials, for example silicon oxide, silicon nitride, or silicon oxynitride, preferably such that an increase in surface roughness, that would significantly decrease the bond energy between said surfaces, results. Alternatively, the height or depth of conductive features 12a, 12b may be controlled by the formation of a very thin metal layer on the conductive features 12a, 12b. For example, electroless plating of some metals, for example a self-limiting thin layer of gold, approximately 5-50 nm may be coated over the conductive features 12 (for example nickel or nickel alloys). This method may have the additional advantage of terminating an oxidizing metal with very thin non-oxidizing metal, for example gold on nickel, to facilitate the formation of electrical connections.

Figure 4A:
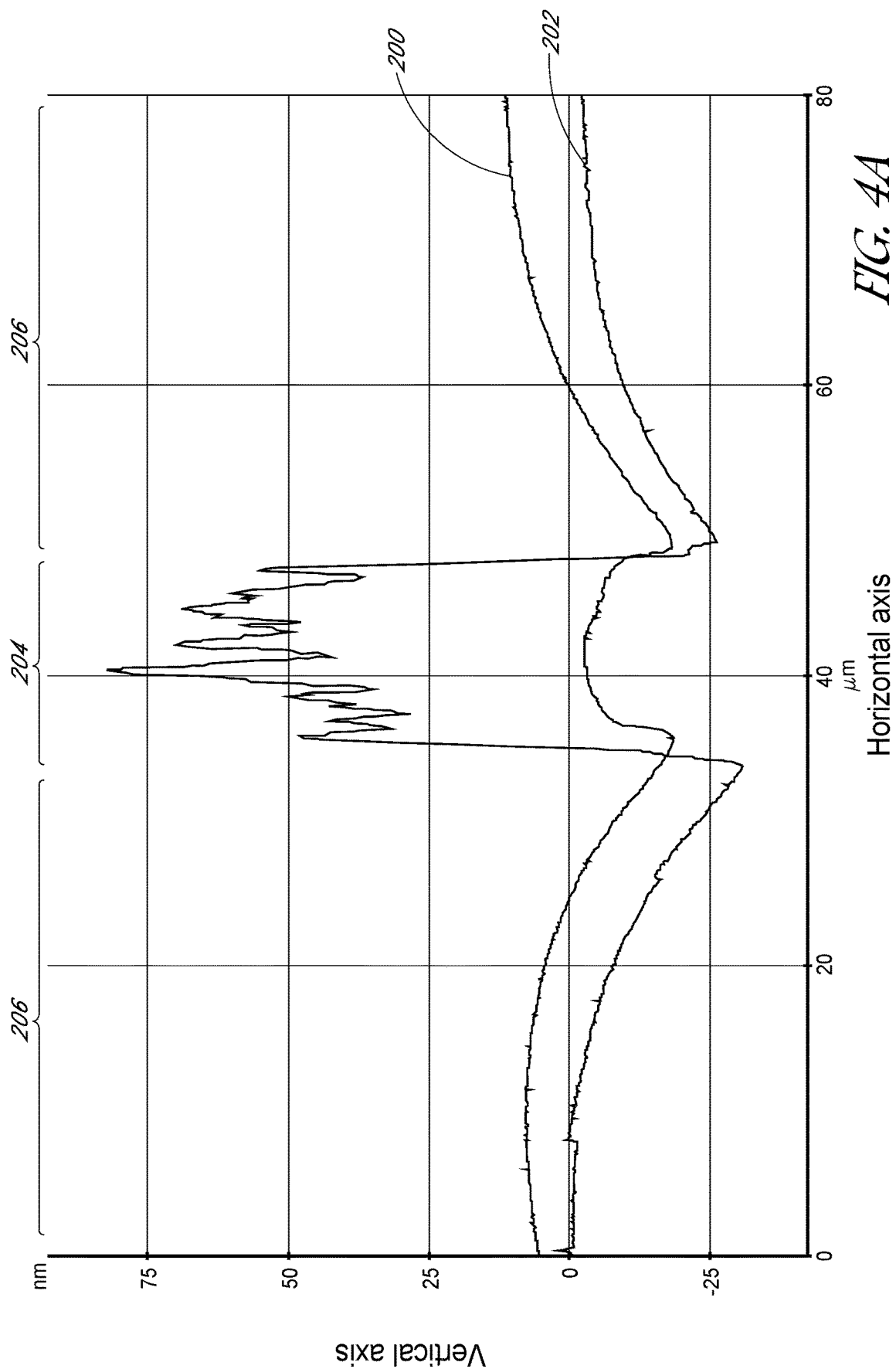
FIG. 4A is a graph showing a measurement of surface levels of a copper (Cu) region and oxide regions of an element, before annealing and after annealing.

FIG. 4A is a graph generated by an atomic force microscope (AFM) showing measurements of surface levels of a copper (Cu) region 204 and oxide regions 206 of an element, at room temperature before annealing 200 and after annealing 202. Both AFM measurements are performed at room temperature. A horizontal axis of the graph shows a horizontal measurement of a surface of the element and a vertical axis of the graph shows a vertical measurement of the surface. As shown in FIG. 4A, the Cu region 204 is comprised at around 35 μm to 50 μm on the horizontal axis and the oxide regions 206 are comprised below about 35 μm and above about 50 μm on the horizontal axis. The element used in this measurement comprises an oxide non-conductive bonding surface and has a 750 μm×750 μm shape with a Cu ring having a width of about 15 μm embedded in the element. The element was prepared with chemical mechanical polishing (CMP) before annealing 200. The annealing was conducted in nitrogen gas for 2 hours at 300° C. Before annealing 200, the Cu region of the graph measures about −12 nm on average on the vertical axis, i.e., about 12 nm below the bonding surface of a surface of the oxide region 206. After annealing the element used in this measurement for 2 hours at 300° C., it was brought back to room temperature and the after annealing 202 AFM measurement was taken. After annealing 202, the Cu region comprises a protrusion or hillock of about 70 nm above the bonding surface of the surface of the oxide region 206. This change after annealing 202 was permanent and due at least in part to plastic deformation of Cu. With a large mismatch between coefficient of thermal expansion (CTE) between copper and silicon oxide, the lateral expansion of copper is constrained (as it is surrounded by oxide) and it mostly expands in the vertical direction. The hillock formation may be caused when a relatively large amount of Cu is annealed as the copper grain growth occurs at this high annealing temperature. Hillocks may form to some extent with a small amount of copper, but the effects of hillock formation may be magnified with larger and/or thicker pads. In some embodiments, a Cu pad that has a width of, for example, more than about 3 μm. In some other embodiments, a Cu pad that has the width of, for example, more than about 7 μm may be problematic. In some embodiments, the Cu pad that has a width in a range of, for example, 2 μm to 500 μm, in a range of, for example, 7 μm to 250 μm, in a range of, for example, 15 μm to 250 μm, in a range of, for example, 25 μm to 100 μm etc. may be problematic. However, it may not be problematic when adequate thermal treatment protocols are utilized during the bonding operation. In some embodiments, a Cu pad that has a surface area of, for example, more than about 10 μm$^2$ may be problematic. In some other embodiments, a Cu pad that has the surface area of, for example, more than about 20 μm$^2$ may be problematic. In some embodiments, Cu pad that has a surface area in a range of, for example, 10 μm$^2$ to 0.25 mm$^2$, in a range of, for example, 20 μm$^2$ to 0.25 mm$^2$, in a range of, for example, 50 μm$^2$ to 0.2 mm$^2$, in a range of, for example, 100 μm$^2$ to 0.2 mm$^2$, etc. may be problematic. However, it should be understood that other factors, such as a thickness of the Cu pad and annealing temperatures, may contribute to the formation of the hillocks. A higher annealing temperature may cause a rougher surface and/or more hillocks on the exposed copper surface than a lower annealing temperature. In some embodiments, hillock formation in the Cu pad may be reduced or suppressed by annealing the Cu pad in vacuum environment. It was also measured that surface roughness of the element changed from about Rq=0.65 nm before annealing 200 to about Rq=33 nm after annealing 202 for the unbounded surface. In practice, during the higher thermal treatment of elements 3 and 2 of FIG. 3B, the conductive features 12a, 12b are separate by the prevailing recess between the conductive features 12a, 12b. The conductive features 12 and 12b are bounded or confined within the prevailing recess and the type of hillocks of FIG. 4A is not exhibited. When bonding a set of elements like that used in this measurement, the changes of the surface level of the Cu region after annealing 202 can create challenges to, for example, forming a reliable and/or uniform Cu to Cu direct bond.

For example, when the conductive features 12a, 12b of FIGS. 3A-3C comprise a relatively large or wide ring (e.g., a seal ring) disposed around an integrated device, annealing may cause the conductive features 12a, 12b (Cu) to protrude above the bonding surface, which can reduce the reliability of a direct bond. For example, for conductive features that have a lateral dimension (e.g., width) larger than about 5 microns (e.g. in a range of 5 microns to 15 microns), hillock formation after annealing can reduce bonding reliability. By contrast, for relatively small contacts (e.g., for conductive features with a lateral dimension or width less than about 5 microns), the conductive features may not form significant hillocks, resulting in a reliable direct bond. Moreover, CMP planarizing process for relatively small pads may not be challenging; and planarization becomes increasingly difficult as pad size increases.

Figure 4B:
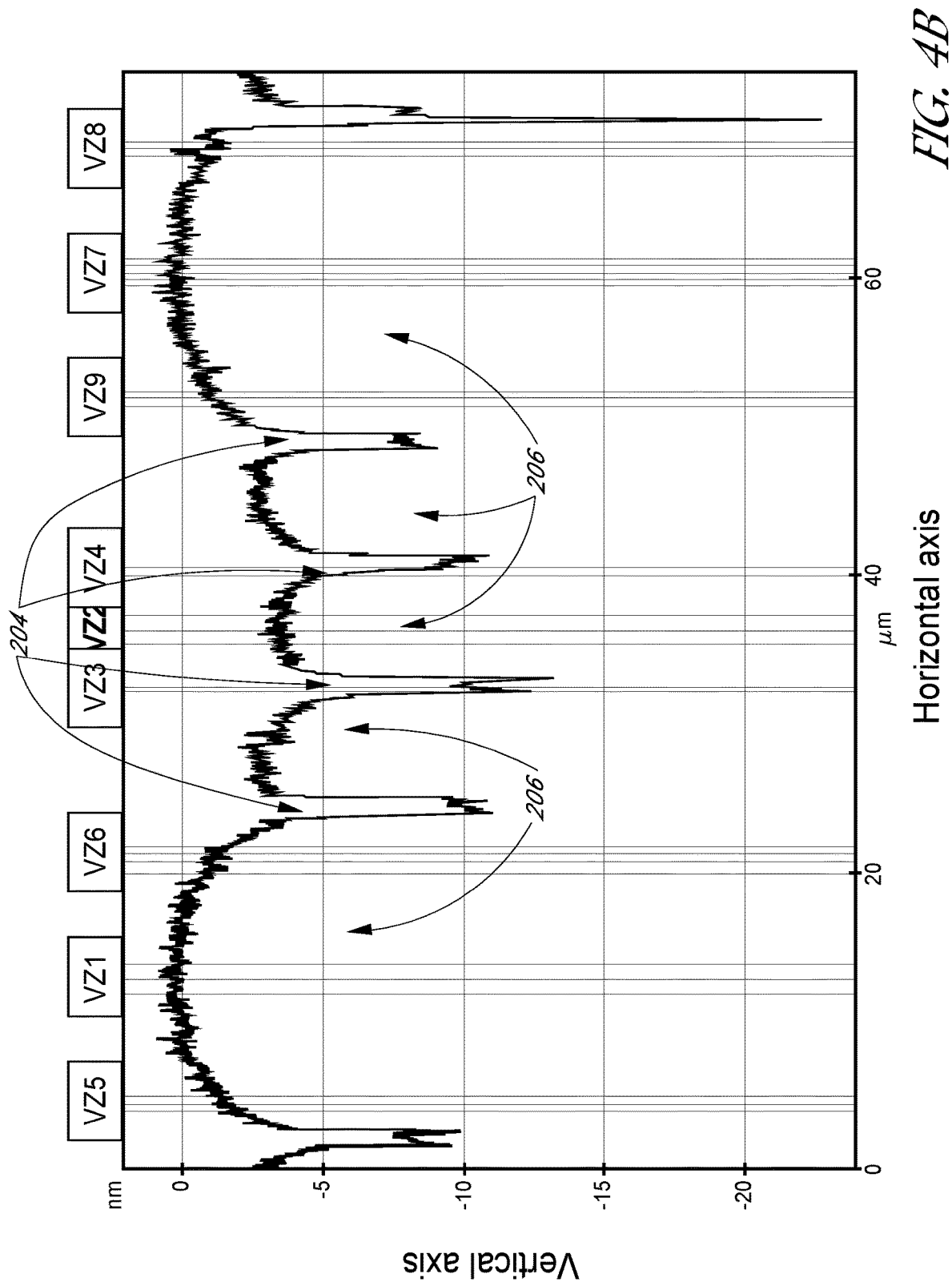
FIG. 4B shows a graph showing a measurement of surface levels of copper (Cu) regions and oxide regions of an element before annealing.

FIGS. 4B and 4C show graphs showing measurements of surface levels of copper (Cu) regions 204 and oxide regions 206 of an element. FIG. 4B shows the measurement of the element after CMP and before annealing. FIG. 4C shows the measurement of the element after annealing at 300° C. for one hour. A horizontal axis of the graph shows a horizontal measurement of a surface of the element and a vertical axis of the graph shows a vertical measurement of the surface. The Cu region 204 comprises 1-micron width grid pattern. In some embodiments, this may be considered as a relatively small pad of Cu or trace. The measurements show recesses from top surfaces of the oxide regions 206 to bottom portions of the Cu regions 204. In the measurement before annealing, as shown in FIG. 4B, the recess is about 6.8 nm in average and after annealing, as shown in FIG. 4C, the recess is about 6.6 nm in average. In some embodiments, this difference may be considered as not significant for a reliable direct bond. Referring back to FIGS. 3A and 3B, for conductive features 12a, 12b with smaller widths, sidewalls of the corresponding recessed spaces 115a, 115b tend to pin or suppress the expansion of the conductive features, as a result, much higher temperature may be needed to bond the elements 3, 2. While for conductive features 12a, 12b with large widths, the sidewall of the corresponding recessed spaces 115a, 115b is less effective in suppressing metal protrusion or hillocks and lower bonding temperature, such as below 250° C., is effective in bonding the elements 3, 2.

Figure 5:
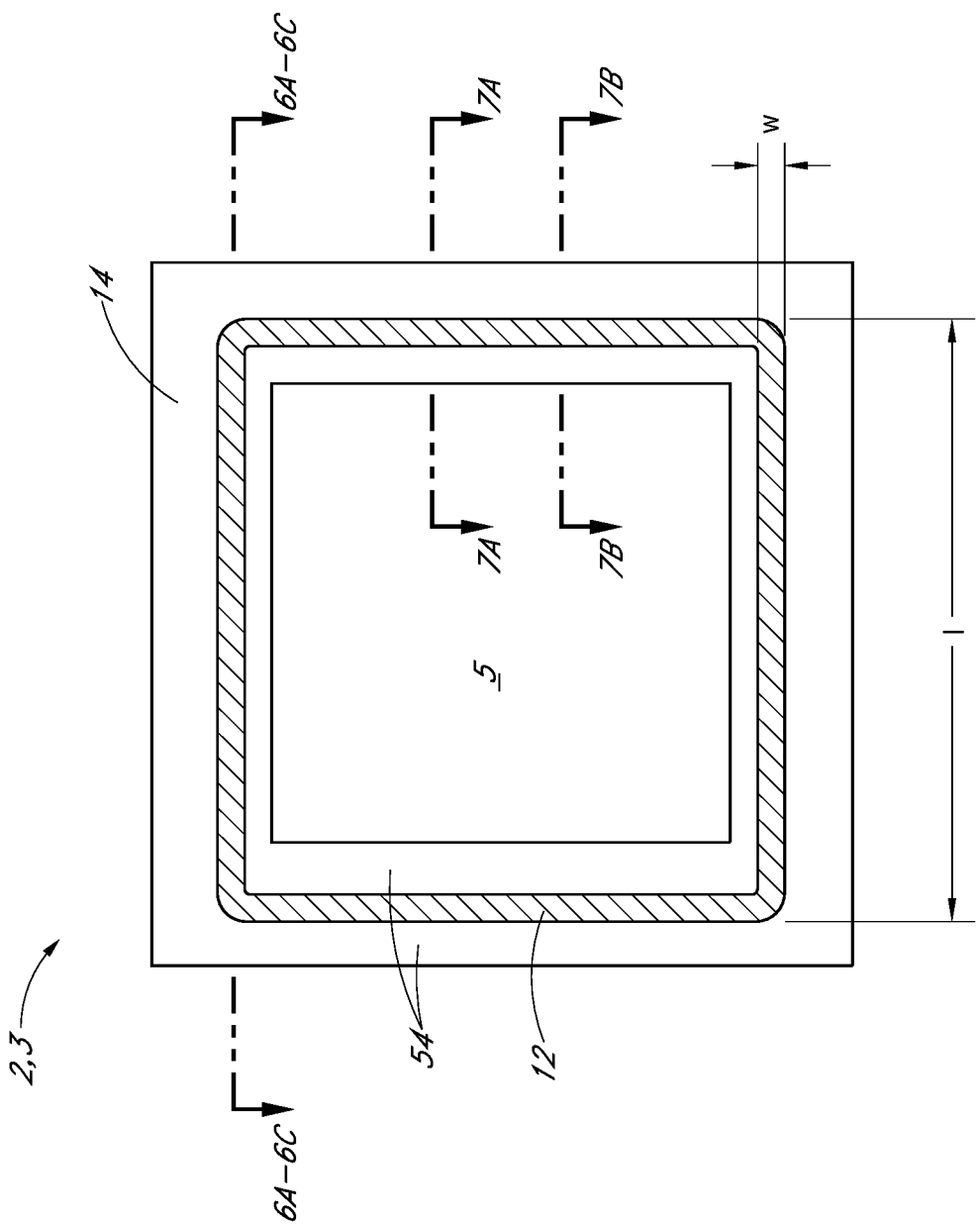
FIG. 5 is a schematic top sectional view of an element having a conductive interface feature and a nonconductive interface feature disposed around a cavity.

FIG. 5 is a schematic top sectional view of an element (e.g., the first or second semiconductor element 3, 2) having a conductive interface feature 12 and a nonconductive interface feature 14 disposed around a cavity 5. The element 3, 2 can include the cavity 5 as shown, but in other embodiments (such as that shown in FIG. 2G), no cavity may be provided. In some embodiments, one or more integrated device(s) may be disposed in the cavity 5, or otherwise within the seal ring defined by the conductive feature 12. The one or more of integrated device(s) may be coupled to or formed with the element 3, 2. The conductive interface feature 12 of FIG. 5 may have similar structural features as the conductive interface feature 12 of FIGS. 2A-2G, so as to substantially seal the integrated device and/or the cavity 5 from the outside environs. For example, as explained above and as shown in FIG. 5, the conductive feature 12 can comprise a completely annular structure disposed about the cavity 5. In other embodiments, such as those shown in FIGS. 2D-2E, the conductive feature 12 can comprise an incomplete annular structure such that there are gaps between portions of the conductive feature 12.

The conductive interface feature 12 can comprise an elongate conductive feature that has a width w and a length l (along at least one side of the ring or annular structure) that is longer than the width w. In some embodiments, for example, the length l may be at least twice the width w. In some embodiments, the conductive interface feature 12 may have the width w in a range of, for example, 2 μm to 30 μm and the length l in a range of 50 μm to 20 mm. The conductive interface feature 12 may comprise a continuous ring that surrounds the cavity 5 as illustrated in FIG. 5. However, as explained above with respect to, for example, FIGS. 2A to 2G, the conductive interface feature 12 may have any suitable structure that effectively seals the interior of the bonded structure (e.g., the cavity 5 and/or integrated devices) from the outside environs.

Furthermore, although the conductive feature 12 shown herein comprises an annular structure or ring about the cavity 5, other embodiments disclosed herein can be used in conjunction with conductive interface features that may not be disposed around an integrated device or cavity. For example, other embodiments disclosed herein may be used with other types of elongate contact features that are not formed in an annular pattern, but which have a length l greater than its width w. For example, the embodiments disclosed herein may also be used in conjunction with the elongate contact features disclosed throughout U.S. Pat. No. 9,852,988, the entire contents of which are incorporated by reference herein in their entirety and for all purposes. Indeed, the embodiments disclosed herein can be used in conjunction with any suitable conductive interface features that have a relatively large volume of conductive (e.g., metallic) material, for example, with conductive features having a lateral dimension (e.g., width) greater than about 5 microns.

FIG. 6A is a cross sectional view of the semiconductor element 3, 2 shown in FIG. 5, taken along the length of the conductive interface feature 12, according to one embodiment. The conductive interface feature 12 may comprise any suitable material, such as, for example, copper (Cu). The conductive feature 12 includes recesses 218 on a back side 220 (e.g., opposite the bonding surface) of the conductive interface feature 212. In some embodiments, the recesses 218 may be formed as a result of depositing metal over previously formed islands, such as dielectric posts 50, as described in examples of formation below. The nonconductive interface feature 14 may comprise any suitable material, such as, for example, silicon oxide and/or silicon nitride. Other underlying portions 52 of the nonconductive feature 14 may be disposed along the back side 220 of the conductive feature 12. Additionally, adjacent portions 54 of the nonconductive feature 14 may be disposed laterally adjacent the conductive feature 12 as shown above in FIG. 5. Thus, on a particular element 3 or 2, the nonconductive feature 14 can include portions disposed adjacent the conductive feature 12 (e.g., as shown by the adjacent portions 54 in FIG. 5), portions disposed underneath the conductive feature 12 (e.g., the underlying portion 52), and a nonconductive island, such as the illustrated dielectric post 50, disposed in the recesses 218. In some embodiments, different portions of the nonconductive feature 14 may comprise different materials. For example, the nonconductive feature 14 may comprise a silicon oxide layer and a silicon nitride layer. Example processes for forming the nonconductive islands and complementary conductive recesses are described below.

The recesses 218 may prevent or mitigate the hillock formation that is observed in FIG. 4A for conductive features that are relatively large (e.g., for conductive features that have lateral dimensions greater than about 5 microns). For example, the recesses 218 may reduce a thickness of the conductive interface feature 12 measured from the back side 220 to a front side 222 opposite the back side which may prevent or mitigate the hillock formation. For example, the dielectric posts 50 can act as expansion constraints such that the conductive feature 12 may effectively expand in a vertical direction without causing hillocks, resulting in an improved direct bond. As mentioned earlier (e.g., in paragraph 70), for relatively small contacts, the conductive features may not form significant hillocks, for example, due to the constraint to its expansion in all 4 lateral dimensions due to the rigid silicon oxide and as it expands only in the vertical direction. For larger pads, as one or more lateral dimensions are relaxed, this may result in plastic deformation, hillock formation and significant increase in rms roughness of the contact pad, as depicted by 202 in FIG. 4. The recesses 218 may be formed in any suitable manner. For example, prior to providing the conductive interface feature 12, portions of the nonconductive feature 14 may be etched such that the dielectric posts 50 are formed, for example, by damascene methods. In some embodiments, for example, to form the dielectric posts 50, a mask may be formed on a first side of the nonconductive feature 14. A cavity in the form of an initial trench 49 may be formed in the nonconductive feature 14 with a first mask by, for example, dry etching (e.g.) reactive ion etching (RIE) or wet etching method to remove portions of the nonconductive feature 14 to a first defined depth. In some embodiments, the first mask can be removed, and a second mask formed to exposes regions for post 50. Similarly, portions of the nonconductive feature 14 is removed by RIE or wet etch methods to a second defined depth, where the second defined depth is shallower than the first defined depth.

After forming the trenches 49 with the dielectric posts 50 therein, the conductive interface feature 12 may be deposited into the trenches 49 etched into the nonconductive feature 14. In some embodiments, a barrier layer and/or a seed layer may be applied over the nonconductive feature 14 and into the trenches 49 to cover the dielectric posts 50, and then metal (such as copper) can fill the trenches 49 (such as by electroplating) and overlie the dielectric posts 50, thus defining the recesses 218 of the conductive interface feature 12. In some embodiments, after coating the conductive interface feature 12, portions of the nonconductive feature 14 and the conductive feature 12 can be removed by, for example, planarization methods to form the bonding surface 222. Still other ways of forming the dielectric posts 50 and other components may be suitable.

The conductive interface feature 12 has a thickness $t_1$ from the front side 222 to the back side 220. In some embodiments, the thickness $t_1$ may be in a range of, for example, 0.5 μm to 5 μm. The recess 218 formed in the conductive interface feature 12 has a recess thickness $t_2$ from the back side 220 of the conductive interface feature to a recessed surface 219, which can be about 50% of the thickness $t_1$ of the conductive interface feature 12. In some embodiments, the thickness $t_2$ can be in a range of, for example, 10% to 90%, 20% to 80%, etc. of the conductive interface feature 12. However, the dimension of the thickness $t_1$ may vary along different portions of the conductive interface feature 12. Therefore, in some embodiments, cross sections of the conductive interface feature 12 along the length taken at different locations may vary. In some embodiments, a first cross section of the conductive interface feature 12 may have the recess 218 but a second cross section of the conductive interface feature 12 may not have the recess.

The conductive interface feature 12 can have a pitch or displacement dimension $d_1$ from one recess to a next recess, and the recess can have a lateral dimension $d_2$ in a horizontal direction. In some embodiments, the displacement dimension $d_1$ may depend on the number of recesses 218 that are formed in the conductive interface feature 12. For example, the displacement dimension $d_1$ is less than the length l of the conductive interface feature 12. The dimension $d_2$ of the recess 218 may be less than 50% of the length l of the conductive interface feature 12. The dimension $d_2$ of the recess 218 may be more than 1 μm. In some embodiments, the dimension $d_2$ of the recess 218 may be in a range of, for example, 2 μm to 10 μm. However, the dimension of the dimensions $d_1$ and $d_2$ may vary along different portions of the conductive interface feature. Therefore, in some embodiments, cross sections of the conductive interface feature along the length taken at different locations may vary.

A skilled artisan will understand that, while the recess 218 shown in FIG. 6A has a polygonal shape (e.g., a trapezoid shape), the recess 218 may have any suitable shape, as viewed from a side cross-section. The shape of the recess may depend at least in part on the manufacturing process(es) used, in some embodiments. Further, the recesses may not have identical sizes in some embodiments. For example, the conductive interface feature 12 may have a varying width with differently sized recesses along the length of the length.

FIG. 6B is a cross sectional view of the semiconductor element 3, 2 of FIG. 5, taken along a length of the conductive interface feature 12, according to another embodiment. Instead of having two recesses 218 illustrated in FIG. 6A, FIG. 6B shows more than two (e.g., nine) recesses formed through the back side 220 of the conductive interface feature 12 along its length. It should be understood that the number of recesses may be chosen based at least in part on the length l of the conductive interface feature 12, the thickness $t_1$ of the conductive interface feature 12, the recess thickness $t_2$ of the conductive interface feature 12, and/or the dimension $d_2$ of the recess 218. Having more recesses may reduce the amount of the conductive interface feature 12 and produce more constraint on the conductive interface feature 12 to expand in the vertical dimension used in the semiconductor element 3, 2.

FIG. 6C is a cross sectional view of the semiconductor element 3, 2 of FIG. 5, taken along a length of the conductive interface feature 12, according to another embodiment. Unlike the embodiments shown in FIGS. 6A and 6B, the recesses 218 of FIG. 6C can be formed on the front side 222 of the conductive interface feature 12. In such embodiments, unlike the embodiments of FIGS. 6A and 6B where the trench includes the posts 50, the embodiment of FIG. 6C can include dielectric islands 51. The dielectric islands 51 may be formed, for example, after filling the conductive interface feature 12 (such as copper) into the trench 49. At least a portion of the conductive interface feature 12 can be removed from the front side 222 and the dielectric can be disposed into the removed portion. In such embodiments, the trench includes the posts 51. Although FIG. 6C shows the thickness $t_2$ of the dielectric island 51 as being smaller than thickness $t_1$, in some other embodiments the thickness $t_2$ may be the same as the thickness $t_1$. In some embodiments, a combination of a front side recess arrangement and a back side recess arrangement may be provided on a conductive interface feature 12. As with the embodiments of FIGS. 6A and 6B, the conductive interface feature may comprise any suitable number of recesses, and any suitable shapes of recesses formed therein. Embodiments shown in FIGS. 6A and 6B (and FIG. 6C where the thickness $t_2$ is equal to the thickness $t_1$) can be manufactured using, for example, a dual damascene process. Embodiment shown in FIG. 6C may be a single damascene process; a via can be made in the conductive trace, which can be back-filled by non-conductive material, e.g. silicon oxide, nitride or the combination of both.

FIG. 6D is a top plan view of a portion of the conductive and non-conductive features 12, 14 shown in FIG. 6C. FIG. 6D shows the conductive interface feature 12 and the nonconductive feature 14 disposed in the recesses 218. As shown in FIG. 6D, the dielectric islands 51 can be surrounded laterally by conductive material of the conductive interface feature 12, which can improve the sealability provided by the conductive feature 12. The recesses 218 shown in FIG. 6D have a dimension $d_3$, which is measured along the lateral dimension of the conductive interface feature 12, that is smaller than the width w, leaving portions of the conductive interface feature 12 on the front side 222 for forming a continuous periphery for sealing the cavity 5 when bonded to another element.

Figure 7B:
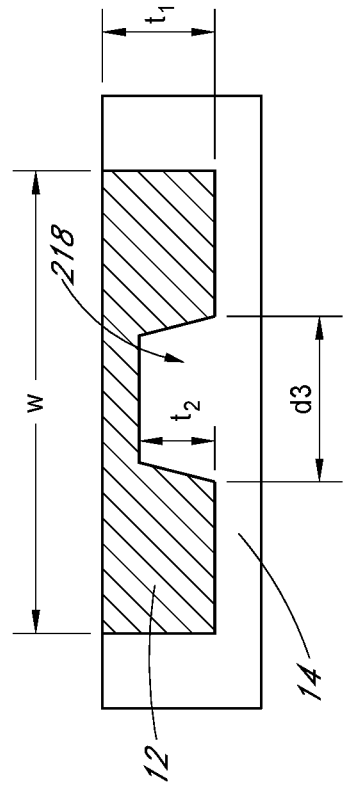
FIG. 7B is a cross sectional view of the semiconductor element of FIG. 5, taken across a width of the conductive interface feature at a different location along the length as compared with the cross-section of FIG. 7A.
Figure 7A:
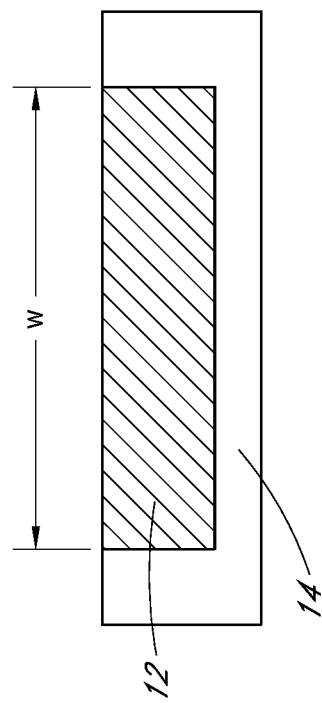
FIG. 7A is a cross sectional view of the semiconductor element of FIG. 5, taken across a width of the conductive interface feature, according to one embodiment.

FIG. 7A is a cross sectional view of the semiconductor element 3, 2 of FIG. 5, taken across a width of the conductive interface feature 12, according to one embodiment. FIG. 7A shows the conductive interface feature 12 and the nonconductive interface feature 14 underlying the conductive feature 12. The illustrated cross section in FIG. 7A (see FIG. 5 for the location of the cross-section) does not include a recess. Rather, in the cross-section shown in FIG. 7A, the conductive interface feature 12 may have a generally constant thickness across the width of the element.

FIG. 7B is a cross sectional view of the semiconductor element 3, 2 of FIG. 5, taken across a width of the conductive interface feature 12 at a different location along the length as compared with the cross-section of FIG. 7A. The recess 218 has the dimension d3 measured along the width of the conductive interface feature 12 that is perpendicular to the dimension $d_2$. The dimension d3 of the recess 218 may be in a range of 10% to 80% of the width w of the conductive feature 12. In some embodiments, there may be a plurality of recesses along the width of the conductive interface feature 212.

Figure 8A:
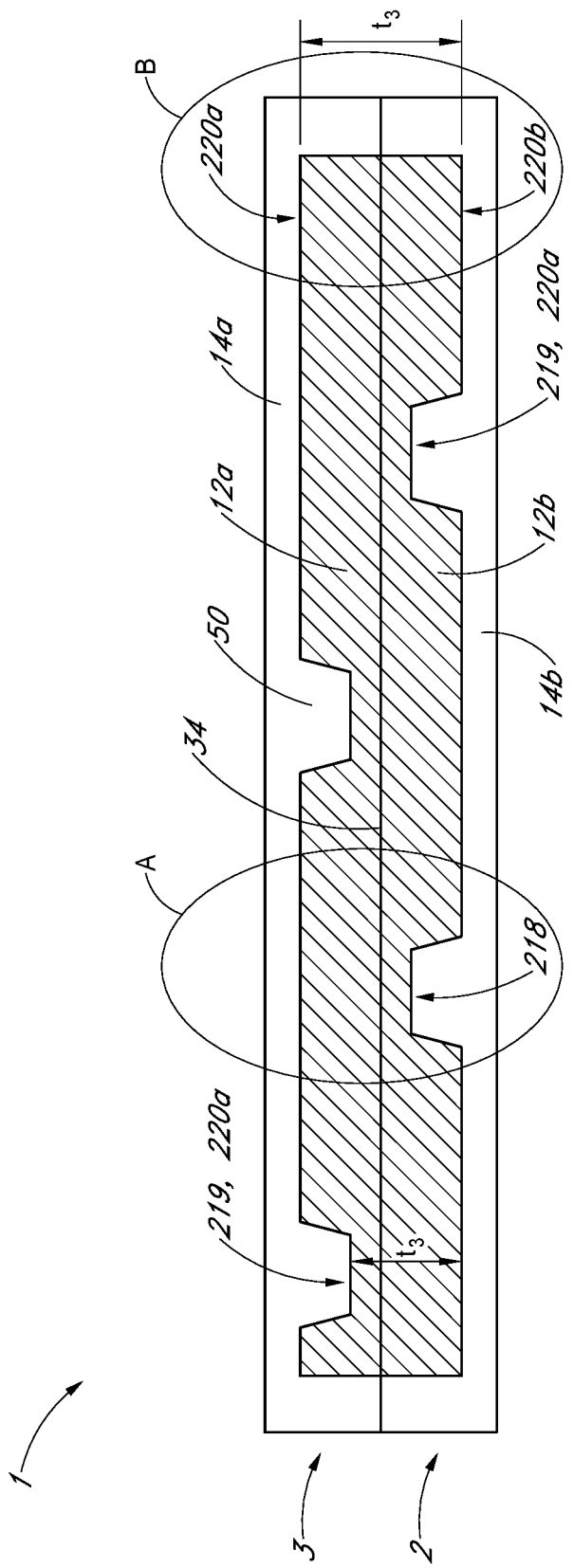
FIG. 8A is a cross sectional view of a bonded structure, taken along a length of the conductive interface feature, according to one embodiment.

FIG. 8A is a cross sectional view of a bonded structure 1, taken along a length of the conductive interface feature 12, according to one embodiment. The bonded structure 1 may comprise a first element 3 and a second element 2 directly bonded to the first element 3 without an intervening adhesive. The first and second elements 3, 2 of FIG. 8A may include recesses 218 similar to those illustrated in FIGS. 6A and 6B, e.g., the recesses 218 may be provided in respective back sides 220 of the conductive features 12 (e.g., opposite the bonding surfaces of the elements 3, 2). The bonded structure 1 comprises a bonded conductive interface feature 34 that may comprise first and second conductive interface structures 12a, 12b, and first and second nonconductive interface features 14a, 14b.

The bonded conductive interface feature 34 may have recesses 218. In some embodiments, as illustrated in FIG. 8A, the recesses 218 may be formed on a back side 220a of the first conductive feature 12a on the element 3 and/or on a back side 220b of the second conductive feature 12b of the element 2 of the bonded conductive interface feature 34. The back sides 220a, 220b may comprise recessed surface 219. The bonded conductive interface feature 34 may have an overall thickness $t_3$ from the back side 220a of the first element 3 to the back side 220b of the second element 2. The thickness $t_3$ may vary along the length l (and/or the width w) of the bonded conductive interface feature 34. As used herein, the back sides 220a, 220b may follow the contours along the back surface of the conductive features 12a, 12b, such that the overall thickness $t_3$ varies along the length and/or width of the bonded structure (e.g., the back sides 220a, 220b follow the contours of the recessed surface 219 as well as the non-recessed surfaces and the angled surfaces between the recessed surface 219 and the non-recessed surfaces). For example, the thickness $t_3$ at recess portions (such as the portion shown in Region A in FIG. 8A) may be smaller than the thickness $t_3$ at portions that do not have the recess (such as the portion shown in Region B in FIG. 8A). In another embodiments, the recess 218 in element 2 and recess 218 in element 3 are on top of each other, hence $t_3$ would be even smaller than that shown in Region A in FIG. 8A.

Figure 8B:
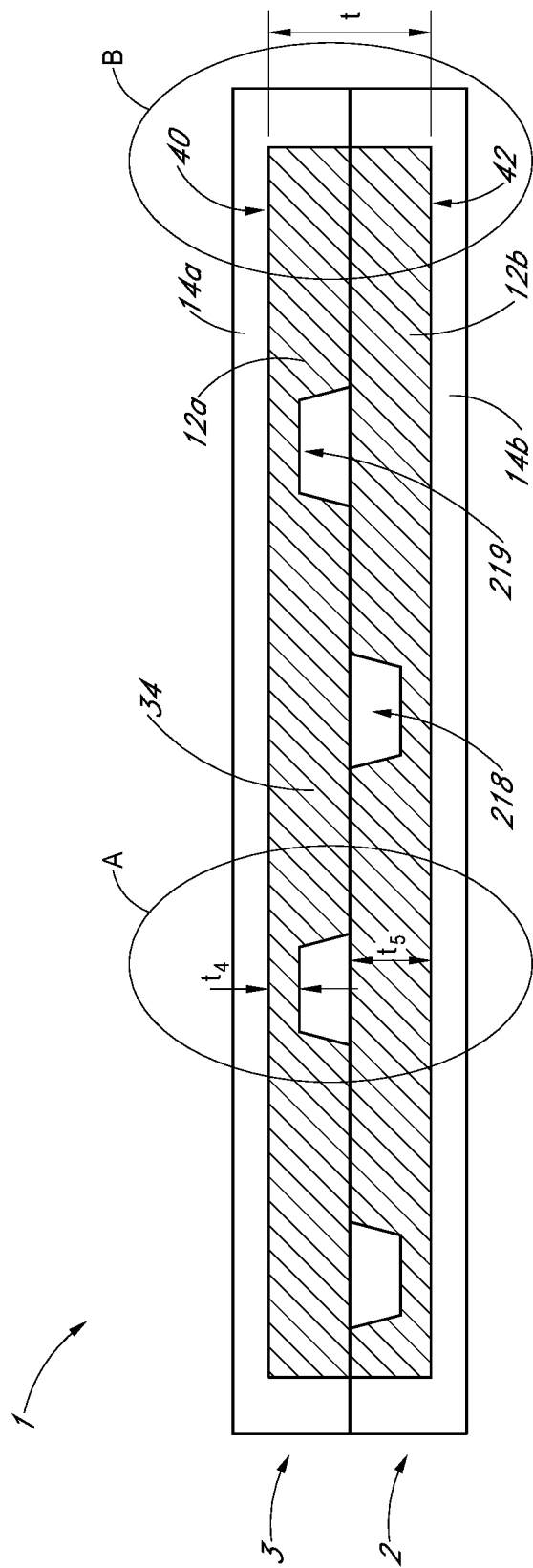
FIG. 8B is a cross sectional view of a bonded structure along a length of the conductive interface feature, according to another embodiment.

FIG. 8B is a cross sectional view of a bonded structure 1 taken along a length of the conductive interface feature 12, according to another embodiment. The bonded structure 1 may comprise a first element 3 and a second element 2 directly bonded to the first element 3 without an intervening adhesive. The first and second elements 3, 2 of FIG. 8B may include recesses 218 similar to those illustrated in FIGS. 6C and 6D, e.g., the recesses 218 may be provided in respective front sides 222 of the conductive features 12 (e.g., along the bonding surfaces of the elements 3, 2). The bonded structure 1 comprises a bonded conductive interface feature 34 that may comprise first and second conductive interface structures 12a, 12b, and first and second nonconductive interface features 14a, 14b. The nonconductive interface features 14a, 14b in the recesses 218 illustrated in FIG. 8B may be isolated from portions of the nonconductive interface features 14a, 14b that are disposed on the back sides 220a, 220b of the elements 3, 2. In some embodiments, the number of recesses 218 formed in the bonded structure 1 may vary along different portions of the conductive interface feature 12. Therefore, in some embodiments, cross sections of the bonded conductive interface feature 34 along the length taken at different locations may vary. In some embodiments, a first cross section of the bonded structure 1 may have the recess 218 (Region A) but a second cross section of the conductive interface feature 12 may not have the recess (Region B). For example, as shown in FIG. 8B, in Region A, the overall or total thickness may be given by $t_4+t_5$ along a particular cross-section. In Region B, the overall or total thickness may be t. Hence, at different locations or cross-sections along the length of the bonded structure, different amounts of the bonded conductive interface feature 34 may be formed. The different amounts of the bonded conductive interface feature at different locations along the length of the bonded conductive interface feature 34 may reduce the chance of before mentioned hillock formation. In some embodiments, the recesses 218 of the elements 2, 3 may fully or partially overlap. For example, the respective recesses 219, 218 of the first element 3 and the second element 2 may at least partially overlap to, for example, bond intimately contact during the bond process. The bonded recesses 218, 219 secure the opposing conductive interface feature 12a, 12b of elements 3, 2 in intimate contact for their bonding at subsequent times or subsequent higher temperature processing. As explained above, this is one of the additional benefits of having the recesses 218, 219.

Figure 9A:
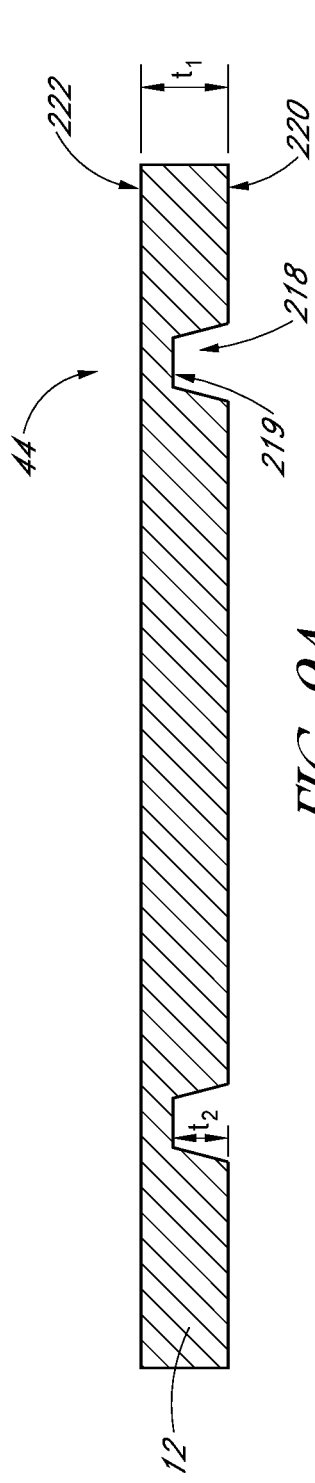
FIG. 9A is a cross sectional side view of a conductive interface feature with recesses formed therein.

FIG. 9A is a cross sectional side view of a conductive interface feature 12 with recesses 218 formed therein. Portions 44 of the conductive interface feature 12 where the recesses 218 are formed have a shortened thickness defined by the thickness $t_1$ from a front side 222 to the back side 220 minus the recess thickness $t_2$ from the back side 220 of the conductive interface feature to a recessed surface 219.

Figure 9B:
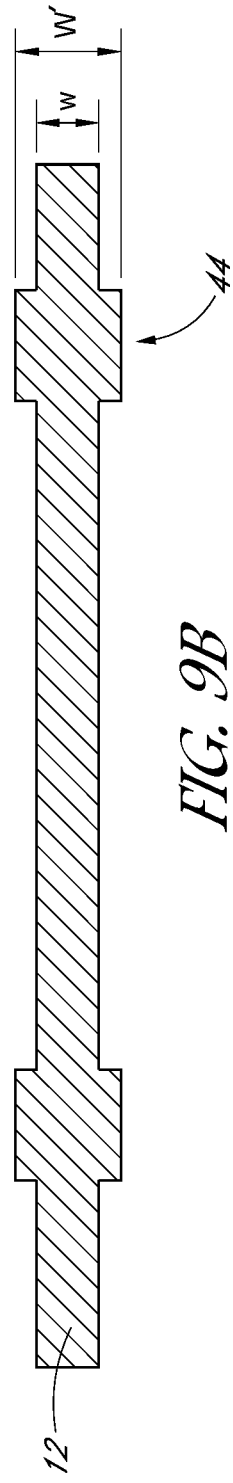
FIG. 9B is a top-down plan view of the conductive interface feature shown in FIG. 9A.

FIG. 9B is a top-down plan view of the conductive interface feature 12 shown in FIG. 9A. The conductive interface feature 12 may have extended width portions 44 at the portions of the conductive interface feature 12 where the recesses 218 are formed to, for example, strengthen the bonding strength. The extended width portions 44 can extend laterally outwards from the conductive feature 12. The increased surface area provided by the extended width portions 44 can improve sealability as well as mechanical strength of the portions of the conductive interface feature 12 overlying (or underlying) the recesses 218. The extended width portions 44 may have an extended width w' that is about 150% (e.g., 120% to 180%) of the width w of portions of the conductive interface feature 12 that do not include the recesses 218.

Figure 9C:
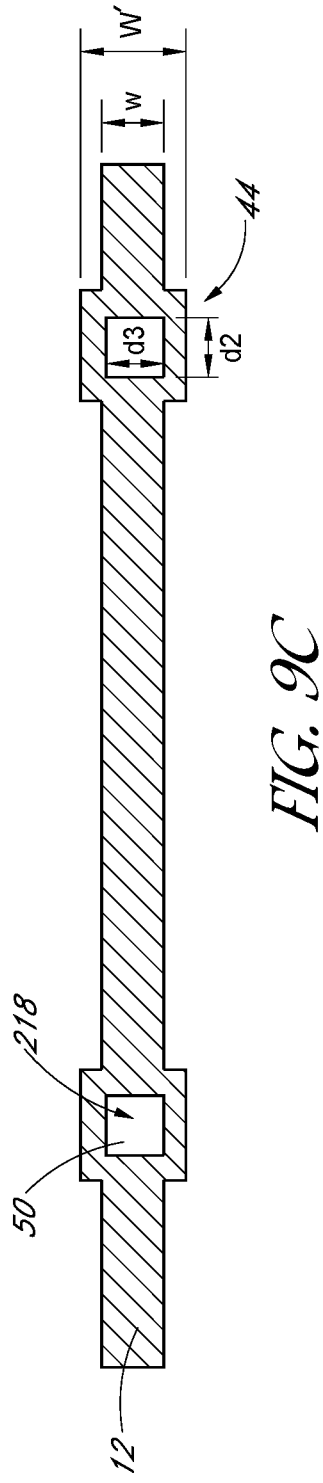
FIG. 9C is a bottom-up view of the conductive interface feature shown in FIGS. 9A and 9B.

FIG. 9C is a bottom-up view of the conductive interface feature 12 shown in FIGS. 9A and 9B. The recesses 218 are disposed within the extended width portions 44. In some embodiments, determination of the extended width w' may depend at least in part on the horizontal dimensions $d_2$, $d_3$ of the recesses 218. Although recesses 218 and extended width portions 44 are shown to be square or rectangular shape, they may be of any other shape. e.g. circular, oval, etc.

Figure 10:
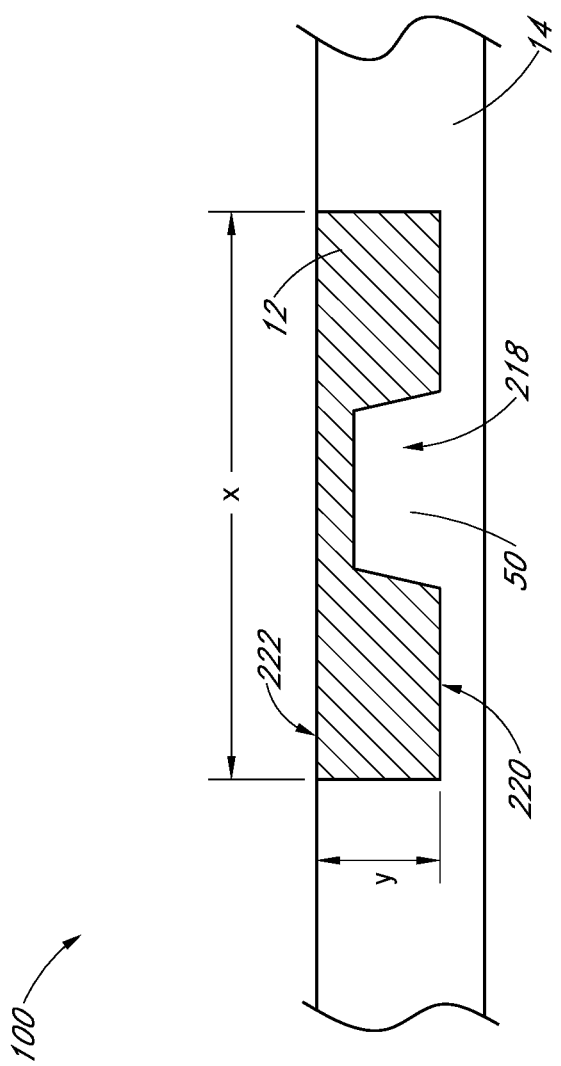
FIG. 10 is a cross sectional view of a portion of a semiconductor element, according to some embodiments.

FIG. 10 is a cross sectional view of a portion of a semiconductor element 100, according to various embodiments. The semiconductor element 100 includes a conductive interface feature 12 and a nonconductive interface feature 14. The conductive interface feature 12 has a front side 222 and a back side 220. The conductive interface feature 12 can have a recess 218 on the back side 220. The nonconductive interface feature 14 can have a first portion 50 that is disposed laterally adjacent to the conductive interface feature 12. The nonconductive interface feature 14 can also have a second portion that is disposed in the recess 218. As used herein, the conductive interface features 12 can be formed in one level of metallization according to some embodiments.

In the embodiment of FIG. 10, the conductive interface feature 12 can comprise a bond pad or other type of contact, which may be elongated (e.g., having a length greater than its width) or may not be elongated. In such embodiments, the conductive feature 12 may comprise a large amount of conductive (e.g., metallic) material, but may not extend around the integrated device in an annular seal structure. Accordingly, the embodiments disclosed herein can be utilized in embodiments in which a large amount of conductive material is used for bond pads (in addition to embodiments that utilize elongate conductive features and/or conductive features that define an effectively annular or closed profile). The conductive interface feature 12 of FIG. 10 may have a length x and a width y. In some embodiments, the length x can be in a range of 2 um to 50 um and the width y can be in a range of 0.2 um to 50 um. The recess 218 can allow for reduction of the amount of the conductive interface feature 12 used in the element 100. Although one recess 218 is shown in FIG. 10, a skilled artisan will understand that more than one recesses 218 can be formed.

In one aspect, a bonded structure is disclosed. The bonded structure comprises a first element, a second element bonded to the first element along a bonding interface. The bonding interface comprises an elongate conductive interface feature and a nonconductive interface feature. The bonded structure also includes an integrated device that is coupled to or formed with the first element or the second element. The elongate conductive interface feature comprises a recess through a portion of a thickness of the elongate conductive interface feature. A portion of the nonconductive interface feature is disposed in the recess.

In one aspect, a bonded structure is disclosed. The bonded structure includes a first element and a second element. The first element comprises a first conductive interface feature and a first nonconductive interface feature. The second element comprises a second conductive interface feature and a second nonconductive interface feature. The second element is bonded to the first element along a bonding interface. A first cross-section of the first conductive interface feature that is taken along a lateral dimension of the first conductive interface feature has a first overall thickness along a vertical dimension transverse to the lateral dimension. A second cross-section of the first conductive interface feature along the lateral dimension of the first conductive feature has a second overall thickness along the vertical dimension. The first overall thickness is different from the second overall thickness.

In one aspect, a semiconductor element is disclosed. The semiconductor element includes a metallic interface feature and a nonconductive interface feature. The metallic interface feature comprises a recess through a portion of a thickness of the metallic interface feature. The nonconductive interface feature comprises a first portion that is disposed laterally adjacent to the metallic interface feature and a second portion disposed in the recess. The semiconductor element further includes an integrated device coupled to or formed with the semiconductor element. The integrated device is in electrical communication with the metallic interface feature.

In one aspect, a method of forming an apparatus is disclosed. The method includes forming a first element comprises a first elongate conductive interface feature and a first nonconductive interface feature. The method also includes forming a second element that comprises a second elongate conductive interface feature and a second nonconductive interface feature. The method further includes bonding the first and second elements along a bonding interface. The bonding interface comprises the first and second elongate conductive interface features and the first and second nonconductive interface features. The first elongate conductive interface structure is formed over a nonconductive post in the first element.

In one aspect, a semiconductor element is disclosed. The semiconductor element includes a first elongate conductive layer that is embedded in a non-conductive layer. The first elongate conductive layer has a thickness that varies along its length. The semiconductor element also includes a second elongate conductive layer that is embedded in the non-conductive layer. The semiconductor element further includes an integrated device. The first and second elongate conductive layers are disposed around the integrated device. The first and second elongate conductive layers comprise a maze-like structure including a plurality of turns.

In one aspect, a bonded structure is disclosed. The bonded structure includes a first element that comprises a first conductive layer and a nonconductive interface feature. The first conductive layer has a thickness that varies along its length. The bonded structure also includes a second element that comprises a second conductive layer that is directly bonded to the first element. The first element comprises a first elongate conductive layer that is embedded in a first non-conductive layer of the first element. The bonded first and second elongate conductive layers of the first and second elements comprises a maze-like structure including a plurality of turns.

For purposes of summarizing the disclosed embodiments and the advantages achieved over the prior art, certain objects and advantages have been described herein. Of course, it is to be understood that not necessarily all such objects or advantages may be achieved in accordance with any particular embodiment. Thus, for example, those skilled in the art will recognize that the disclosed implementations may be embodied or carried out in a manner that achieves or optimizes one advantage or group of advantages as taught or suggested herein without necessarily achieving other objects or advantages as may be taught or suggested herein.

All of these embodiments are intended to be within the scope of this disclosure. These and other embodiments will become readily apparent to those skilled in the art from the following detailed description of the embodiments having reference to the attached figures, the claims not being limited to any particular embodiment(s) disclosed. Although this certain embodiments and examples have been disclosed herein, it will be understood by those skilled in the art that the disclosed implementations extend beyond the specifically disclosed embodiments to other alternative embodiments and/or uses and obvious modifications and equivalents thereof. In addition, while several variations have been shown and described in detail, other modifications will be readily apparent to those of skill in the art based upon this disclosure. It is also contemplated that various combinations or sub-combinations of the specific features and aspects of the embodiments may be made and still fall within the scope. It should be understood that various features and aspects of the disclosed embodiments can be combined with, or substituted for, one another in order to form varying modes of the disclosed implementations. Thus, it is intended that the scope of the subject matter herein disclosed should not be limited by the particular disclosed embodiments described above, but should be determined only by a fair reading of the claims that follow.

What is claimed is:

1. A bonded structure comprising:
   a first element comprising a first conductive interface feature and a first nonconductive interface feature; and
   a second element comprising a second conductive interface feature and a second nonconductive interface feature, the second element being stacked on the first element along a vertical dimension, the second conductive interface feature bonded to the first conductive interface feature along a bonding interface and the second nonconductive interface feature bonded to the first nonconductive interface feature along the bonding interface,
   wherein a first cross-section of the first conductive interface feature taken along a lateral dimension transverse to the vertical dimension of the first conductive interface feature has a first overall thickness along the vertical dimension,
   wherein a second cross-section of the first conductive interface feature along the lateral dimension of the first conductive feature has a second overall thickness along the vertical dimension, the first overall thickness different from the second overall thickness, and wherein the first conductive interface feature has a back side opposite the bonding interface, the nonconductive interface feature disposed over the back side of the first conductive interface feature.

2. The bonded structure of claim 1, further comprising an integrated device coupled to or formed with the first element or the second element.

3. The bonded structure of claim 2, wherein the first conductive interface feature is not electrically connected to the integrated device.

4. The bonded structure of claim 2, wherein the first conductive interface feature is disposed along the bonding interface around the integrated device.

5. The bonded structure of claim 1, wherein the first cross-section of the first conductive interface feature includes a recess formed on a back side of the first conductive interface feature.

6. The bonded structure of claim 1, wherein a height of the first cross-section of the first conductive interface feature is shorter than a height of the second cross-section.

7. The bonded structure of claim 1, wherein the first conductive interface feature is an elongate conductive interface feature that has a length longer than a width.

8. The bonded structure of claim 1, wherein the first cross-section of the first conductive interface feature comprises a first recess portion and the second cross-section of the first conductive interface feature does not comprise a recess.

9. The bonded structure of claim 8, wherein a third cross-section of the first conductive interface feature taken along a lateral dimension of the first conductive interface feature has a third overall thickness along a vertical dimension transverse to the lateral dimension that is different from the second overall thickness.

10. The bonded structure of claim 1, further comprising a cavity formed between the first element and the second element, wherein the first conductive interface feature and the second conductive interface feature forms a hermetic seal ring for the cavity.

\* \* \* \* \*